(12) United States Patent
Tange

(10) Patent No.: US 10,068,035 B2
(45) Date of Patent: Sep. 4, 2018

(54) CONTROL SYSTEM DESIGN ASSIST DEVICE, CONTROL SYSTEM DESIGN ASSIST PROGRAM, CONTROL SYSTEM DESIGN ASSIST METHOD, OPERATION CHANGE AMOUNT CALCULATION DEVICE AND CONTROL DEVICE

(71) Applicant: FUJI ELECTRIC CO., LTD., Kawasaki (JP)

(72) Inventor: Yoshio Tange, Hachioji (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 535 days.

(21) Appl. No.: 14/936,981

(22) Filed: Nov. 10, 2015

(65) Prior Publication Data

US 2016/0063142 A1   Mar. 3, 2016

Related U.S. Application Data

(63) Continuation of application No. PCT/JP2014/077221, filed on Oct. 10, 2014.

(30) Foreign Application Priority Data

Oct. 21, 2013  (JP) .................................. 2013-218092

(51) Int. Cl.
    *G06F 7/60* (2006.01)
    *G06F 17/50* (2006.01)
    (Continued)

(52) U.S. Cl.
    CPC .............. *G06F 17/50* (2013.01); *G05B 11/42* (2013.01); *G06F 17/18* (2013.01)

(58) Field of Classification Search
    None
    See application file for complete search history.

(56) References Cited

U.S. PATENT DOCUMENTS

| 5,347,446 A   | 9/1994  | Iino et al. |              |
|---------------|---------|-------------|--------------|
| 6,081,751 A * | 6/2000  | Luo ........ | G05B 11/42   |
|               |         |             | 700/39       |
| 2006/0224255 A1* | 10/2006 | Tanaka .... | G05B 11/42 |
|               |         |             | 700/42       |

FOREIGN PATENT DOCUMENTS

| JP | 8-83104   | 3/1996 |
| JP | 11-201435 | 7/1999 |

(Continued)

OTHER PUBLICATIONS

International Search Report dated Jan. 13, 2015, in corresponding International Application No. PCT/JP2014/077221.

(Continued)

*Primary Examiner* — Craig C Dorais

(57) ABSTRACT

A control system design assist device which assists design of a control system that controls a control object such that the control object outputs a control amount according to a target value. The design assist device generates a response prediction formula predicting a variation value of the control amount at each control timing included in the sequence of control timings by using an amount of change of the operation amount at each operation timing included in the sequence of operation timings; generates evaluation formulas; and converts a logical product formula into a first first-order predicate logical formula. The design assist device generates a control logical formula indicating a relationship between the current value of the target deviation and the change amount of the operation amount.

10 Claims, 26 Drawing Sheets

(51) Int. Cl.
*G05B 11/42* (2006.01)
*G06F 17/18* (2006.01)

(56) References Cited

FOREIGN PATENT DOCUMENTS

| | | |
|---|---|---|
| JP | 11-328239 | 11/1999 |
| JP | 2004-38618 | 2/2004 |
| JP | 2007-170814 | 7/2007 |

OTHER PUBLICATIONS

T. Fujiwara, "Tuning Method "K/s" of PID Controller also Applicable to Inverse Response characteristics", 1996, vol. 9, No. 11, pp. 495-502.

C. Garcia et al. "Quadratic Programming Solution of Dynamic Matrix Control (DMC)", Chemical Engineering Communications, Gordon and Breach Science Publishers S.A., vol. 46, pp. 73-87, 1986.

H. Anai, "Parametric Robust Control Toolbox by Quantifier Elimination", Journal of the Japan Society of Simulation Technology, Mar. 15, 2006, vol. 25, No. 1, pp. 53-61.

C. Garcia et al. "Quadratic Programming Solution of Dynamic Matrix Control (QDMC)", Chemical Engineering Communications, Gordon and Breach Science Publishers S.A., vol. 46, pp. 73-87, 1986.

Extended European Search Report dated Apr. 10, 2017 in corresponding European Patent Application 14856365.3.

Wang Zhenwei et al., "An intelligent modeling and analysis method of manufacturing process using the first-order predicate logic", Computers & Industrial Engineering, vol. 56, No. 4, Elsevier, May 1, 2009, pp. 1559-1565.

Hirokazu Anai et al., "Parametric Robust Control by Quantifier Elimination", Japan Society for Symbolic and Algebraic Computation vol. 10, No. 1, Aug. 1, 2003, pp. 41-51.

C. C. Hang et al., "A Comparison of Two Design Methods for PID Controllers", Advances in Instrumentation and Control, vol. 48, Instrument Society of America, 1993, pp. 959-967.

\* cited by examiner

CONTROL SYSTEM DESIGN ASSIST DEVICE, CONTROL SYSTEM DESIGN ASSIST PROGRAM, CONTROL SYSTEM DESIGN ASSIST METHOD, OPERATION CHANGE AMOUNT CALCULATION DEVICE AND CONTROL DEVICE

CROSS-REFERENCE TO RELATED APPLICATIONS

This application is a continuation application, filed under 35 U.S.C. § 111(a), of International Application PCT/JP2014/077221 filed on Oct. 10, 2014, and claims foreign priority to, Japanese Patent Application No. 2013-218092 filed on Oct. 21, 2013, the contents of both of which are incorporated herein by reference.

BACKGROUND

1. Field

The present disclosure relates to a control system design assist device, a control system design assist program, a control system design assist method, an operation change amount calculation device and a control device.

2. Description of Related Art

PID (Proportional-Integral-Derivative) control has been used widely in the prior art as a control method in a control system. This PID control system yields particularly good control performance in respect of control objects (plants) where the transfer function is expressed by integral elements, first-order delay elements, waste time elements, second-order delay elements, or the like. Furthermore, various methods for adjusting the PID parameters are known, such as a limit sensitivity method, CHR (Chien-Hrones-Reswick) method, or the like. However, in PID control, the operation amount varies to a greater extent, the larger the difference between the target value and the control amount, and therefore if an inverse response occurs in which the control amount changes in the opposite direction to the target value, with change in the operation amount, then undershooting may occur, and the control system may become instable.

Consequently, Non-Patent Document 1, for example, discloses a PID parameter adjustment method which is compatible with inverse response characteristics, by approximating a loop transfer function with an integral element (K/s), when the transfer function of the control object is expressed by a combination of waste time elements and first-order advance and delay elements. Furthermore, Non-Patent Document 2 or Non-Patent Document 3, for example, disclose model prediction control in which optimization control is carried out by using a state space model and/or time response model of the control object, instead of PID control. Moreover, Non-Patent Document 4, for example, in addition to disclosing standard model prediction control involving on-line execution of a numerical optimization algorithm, also discloses model prediction control in which on-line numerical optimization is made unnecessary by carrying out off-line calculation in advance.

On the other hand, individual inverse response countermeasures are also carried out in respect of particular control objects. For example, Patent Document 1 discloses a boiler drum level control device which carries out feed-forward compensation in order to cancel out inverse response in boiler level control. Furthermore, Patent Document 2, for example, discloses a load control method for a waste-burning power generation plant, in which a combustion air volume is adjusted prior to load variation, and furthermore, inverse response in the event of an increase in the load is suppressed by adjusting the amount of introduced waste after a delay with respect to load variation.

Moreover, technology is also known in which a system control problem, or the like, is expressed as a first-order predicate logical formula, and system optimization is carried out by solving this formula (see, for example, Non-Patent Document 5). More specifically, a first-order predicate logical formula is obtained in which universal quantifiers ($\forall$) or existential quantifiers ($\exists$), which are known generally as quantifiers, are applied to a portion of the variables in a logical formula in which polynomial equations and/or inequalities are joined by connectives, such as logical product ($\wedge$) or logical sum ($\vee$), and the like. System optimization is then carried out by eliminating the variables (bound variables) to which a quantifier has been attached in the first-order predicate logical formula, and deriving a logical formula in which the other variables (free variables) are to be satisfied. For example, Patent Document 3 discloses a control system analysis and design device which converts a control system to a first-order predicate logical formula and analyzes the control system on the basis of this first-order predicate logical formula after eliminating the variables to which a quantifier is attached.

CITATION LIST

Patent Literature

Patent Document 1: Japanese Patent Application Publication No. 2007-170814
Patent Document 2: Japanese Patent Application Publication No. H11-201435
Patent Document 3: Japanese Patent Application Publication No. H11-328239

Non-Patent Literature

Non-Patent Document 1: T. Fujiwara, "Tuning Method "K/s" of PID Controller also Applicable to Inverse Response characteristics", Transactions of the Institute of Systems, Control and Information Engineers, 1996, Vol. 9, No. 11, pp. 495-502
Non-Patent Document 2: Jan M. Maciejowski (ed.), S. Adachi (trans.), M. Kanno (trans.), "Predictive Control with Constraints", Tokyo Denki University Press, January 2005
Non-Patent Document 3: Carlos E. Garcia, A. M. Morshedi, "Quadratic Programming Solution of Dynamic Matrix Control (QDMC)," Chemical Engineering Communications, Gordon and Breach Science Publishers S.A., Vol. 46, pp. 73-87, 1986
Non-Patent Document 4: D. Takagi, N. Hara, K. Konishi, "Comparison of characteristics of model prediction control methods relating to linear systems", Proceedings of 2013 National Conference of Institute of Electrical Engineers of Japan (Vol. 3), 2013, pp. 83-84
Non-Patent Document 5: H. Anai, K. Yokoyama, "Algorithms of quantifier elimination and their applications: optimization by symbolic and algebraic methods", University of Tokyo Press, August 2011, pp. 214-221

SUMMARY

As described above, various countermeasures are implemented in respect of inverse response which is a problem in PID control. However, the inverse response countermeasures disclosed in Patent Document 1 and Patent Document 2 apply only to particular control objects and cannot be applied widely to the control of various systems. Furthermore, the method for adjusting PID parameters in Non-Patent Document 1 is applied only to simple cases where the transfer function of the control object is expressed by a combination of waste time elements and first-order advance and delay elements, and cannot be used for the control of more complex systems.

On the other hand, the model prediction control in Non-Patent Documents 2 and 3 yields high control performance, but requires high computing performance in order to carry out progressive on-line optimization, and therefore involves large implantation costs compared to general PID control. Furthermore, even if on-line calculation is carried out using control rules obtained in advance by off-line calculation, as in Non-Patent Document 4, the control rules become huge in size when the state space of the control object becomes large, and therefore high computing performance is required also.

Moreover, Non-Patent Document 5 and Patent Document 3 each disclose a design method for a control system using a first-order predicate logical formula, but this method does not take account of time response, such as inverse response, and cannot be used directly in the control of complex systems.

The present disclosure which resolves the abovementioned problems is a control system design assist device which assists design of a control system that controls a controlling amount of a control object, to a target value, the design assist device including: a response prediction formula generation unit which, on the basis of a response waveform of the control amount when an operation amount of the control object is changed, a sequence of control timings at which a target deviation, which is a differential between the target value and the control amount, is evaluated, and a sequence of operation timings at which the operation amount is changed, generates a response prediction formula predicting an amount of variation of the control amount from a first value at each control timing included in the sequence of control timings, by using an amount of change of the operation amount at each operation timing included in the sequence of operation timings; an evaluation formula generation unit which generates a first evaluation formula that expresses the target deviation at each of the control timings, as a logical formula, on the basis of the response prediction formula and a current value of the target deviation, and also generates a second evaluation formula that expresses a constraint condition for an amount of change of the operation amount at each of the operation timings, as a logical formula, and a third evaluation formula that expresses a constraint condition for the target deviation at each of the control timings, as a logical formula; a first-order predicate logical formula conversion unit which converts a formula deriving a logical product of the first to third evaluation formulas, into a first first-order predicate logical formula; a quantifier eliminating unit which eliminates variables to which a quantifier has been attached in the first first-order predicate logical formula and generates a control logical formula indicating a relationship between the current value of the target deviation and the change amount of the operation amount; and a display unit which displays a region, in which the control logical formula is established, on a graph.

According to the present disclosure, it is possible to design a control system having improved control performance taking account of time response, such as inverse response, at low cost.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

The following features, at the least, are clear from the description of the disclosure and the accompanying drawings.

(Configuration of Control System Design Assist Device)

Below, the configuration of a control system design assist device according to one embodiment of the present disclosure is described with reference to FIG. 1 and FIG. 2.

Figure 3:
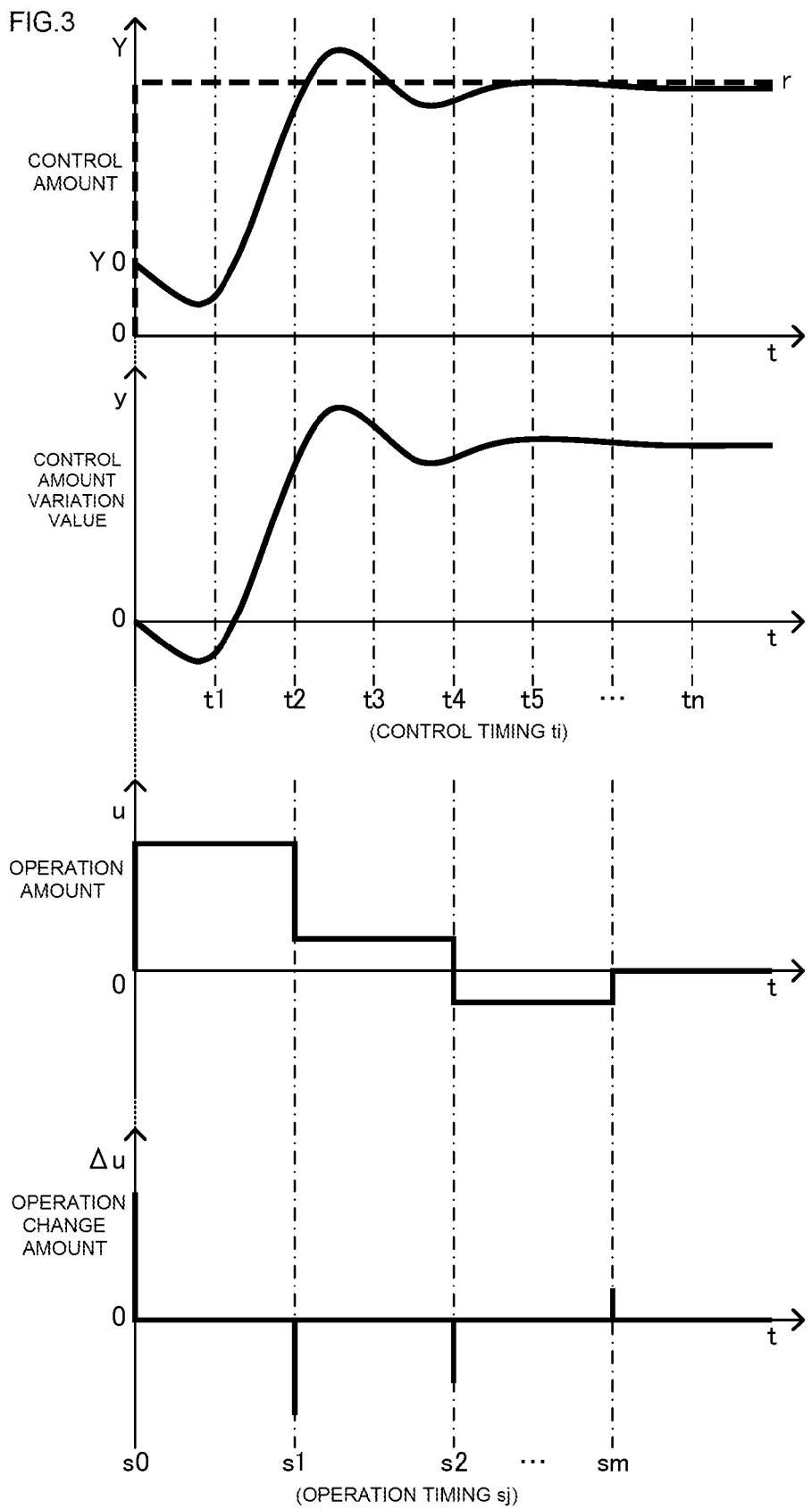
FIG. 3 is a schematic drawing for describing relationships between a control amount Y, a control amount variation value y, an operation amount u, an operation change amount Δu.

Here, firstly, FIG. 3 illustrates the relationship between a control amount, a control amount variation value, an operation amount and an operation change amount which are used in the following description.

The control amount Y is the output of the control object, which is measured by a meter, such as a sensor, and is an amount that is controlled so as to become a set target value r (dash line). On the other hand, the control amount variation value y is the value of the variation of the control amount Y from an initial value Y0 at time t=0, and is given by y(t)=Y(t)−Y0. The control timing ti (i=1, ..., n) is a timing at which the target deviation e (=r−Y), which is the difference between the target value r and the control amount Y, is evaluated.

The operation amount u is the output of the controller, and is an amount of operation performed in order for the control amount Y to follow the target value r. On the other hand, the operation change amount Δu is an amount of change in the operation amount u, and when the control cycle is Tc, then Δu(t)=u(t)−u(t−Tc). The operation timing sj (j=0, ..., m) is a timing at which the operation amount u is changed.

Figure 1:
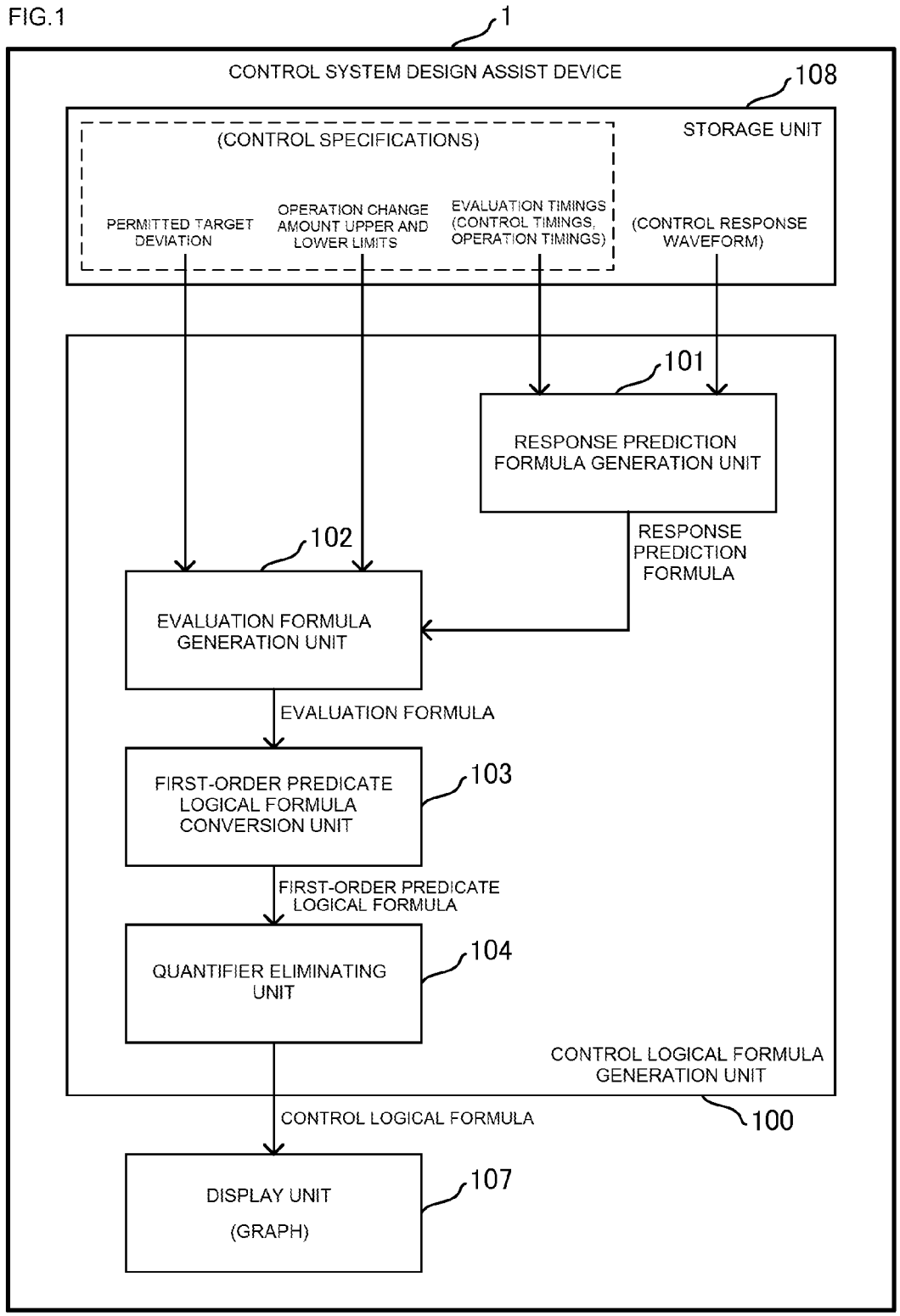
FIG. 1 is a block diagram showing a configuration of a control system design assist device according to one embodiment of the present disclosure.

The control system design assist device 1 shown in FIG. 1 is a device for assisting the design of a control system which controls a control amount Y of a control object, to a target value r, and is configured including a control logical formula generation unit 100, a display unit 107 and a storage unit 108.

Figure 4:
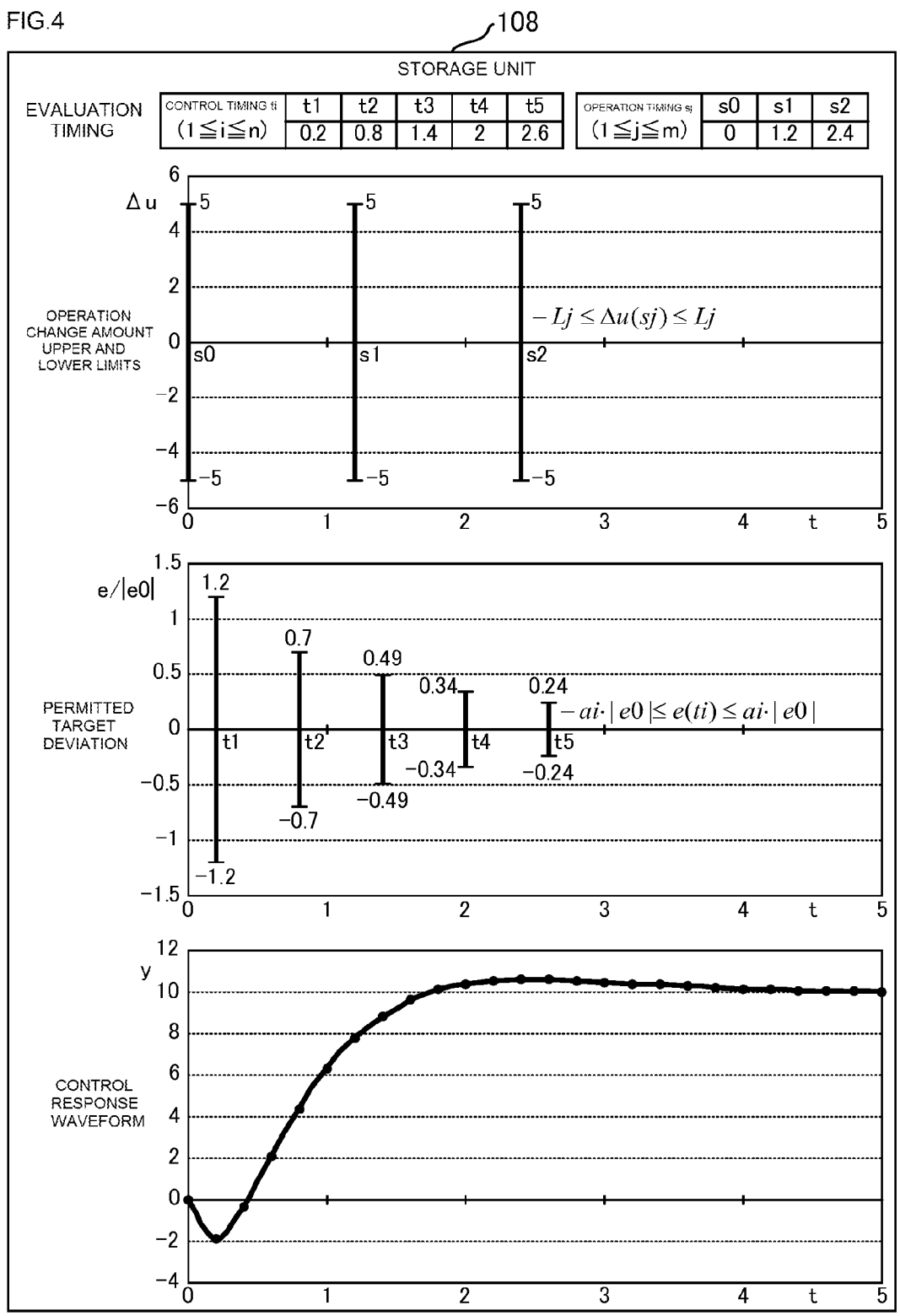
FIG. 4 is a diagram illustrating one example of control specifications and a control response waveform stored in a storage unit 108.

Control specifications and a control response waveform are stored in the storage unit 108. Furthermore, the control specifications include the evaluation timing, the operation change amount upper and lower limits and the permitted target deviation. Here, FIG. 4 shows one example of these control specifications and a control response waveform.

The evaluation timings are made up of a sequence of control timings ti and a sequence of operation timings sj. In the example in FIG. 4, five control timings ti ($1 \le i \le n=5$) and three operation timings sj ($0 \le j \le m=2$) are stored in the storage unit 108.

The operation change amount upper and lower limits are constraint conditions for the operation change amount Δu(sj) at each operation timing sj, and are expressed as in Formula (1) below.

[Expression 1]

$$-Lj \le \Delta u(sj) \le Lj \quad (1)$$

Here, Lj and −Lj are the upper limit value and lower limit value of the operation change amount Δu(sj) at each operation timing sj. In the example in FIG. 4, the upper limit value Lj=5 and the lower limit value −Lj=−5 are stored in the storage unit 108 for all of the operation timings sj.

The permitted target deviation is a constraint condition for the target deviation e(ti) at each control timing ti, and is expressed as shown in Formula (2) below.

[Expression 2]

$$-ai \cdot |e0| \le e(ti) \le ai \cdot |e0| \quad (2)$$

Here, ai and −ai are the upper limit value and lower limit value of the ratio e(ti)/|e0| between the target deviation e(ti) at each control timing ti and the absolute value |e0| of the current value e0 of the target deviation. In the example in FIG. 4, the upper limit value ai and the lower limit value −ai at each control timing ti are stored in the storage unit 108.

The control response waveform is a response waveform of the control amount Y when the operation amount u of the control object is changed. In the example in FIG. 4, time sequence data of the control amount variation value y when the operation amount u at timing t=0 is changed in one unit steps, is stored in the storage unit 108. Instead of inputting a step-shaped signal of the operation amount u, directly to the control object, it is also possible to use time series data of the control amount variation value y, in other words, the response waveform after shaping the target value, which is input to the control object via a target value shaping filter, such as a reference governor.

The control logical formula generation unit 100 is configured including a response prediction formula generation unit 101, an evaluation formula generation unit 102, a first-order predicate logical formula conversion unit 103, and a quantifier eliminating unit 104. A control response waveform and evaluation timing are input to the response prediction formula generation unit 101, and the response prediction formula generation unit 101 outputs a response prediction formula. Furthermore, the response prediction formula, the operation change amount upper and lower limits, and the permitted target deviation are input to the evaluation formula generation unit 102, and the evaluation formula generation unit 102 outputs an evaluation formula. Moreover, the evaluation formula is input to the first-order predicate logical formula conversion unit 103, and the first-order predicate logical formula conversion unit 103 outputs a first-order predicate logical formula. The first-order predicate logical formula is input to the quantifier eliminating unit 104, and the quantifier eliminating unit 104 outputs a control logical formula.

The control logical formula is input to the display unit 107 from the quantifier eliminating unit 104 of the control logical formula generation unit 100. The display unit 107 then displays the control logical formula on a graph.

Figure 2:
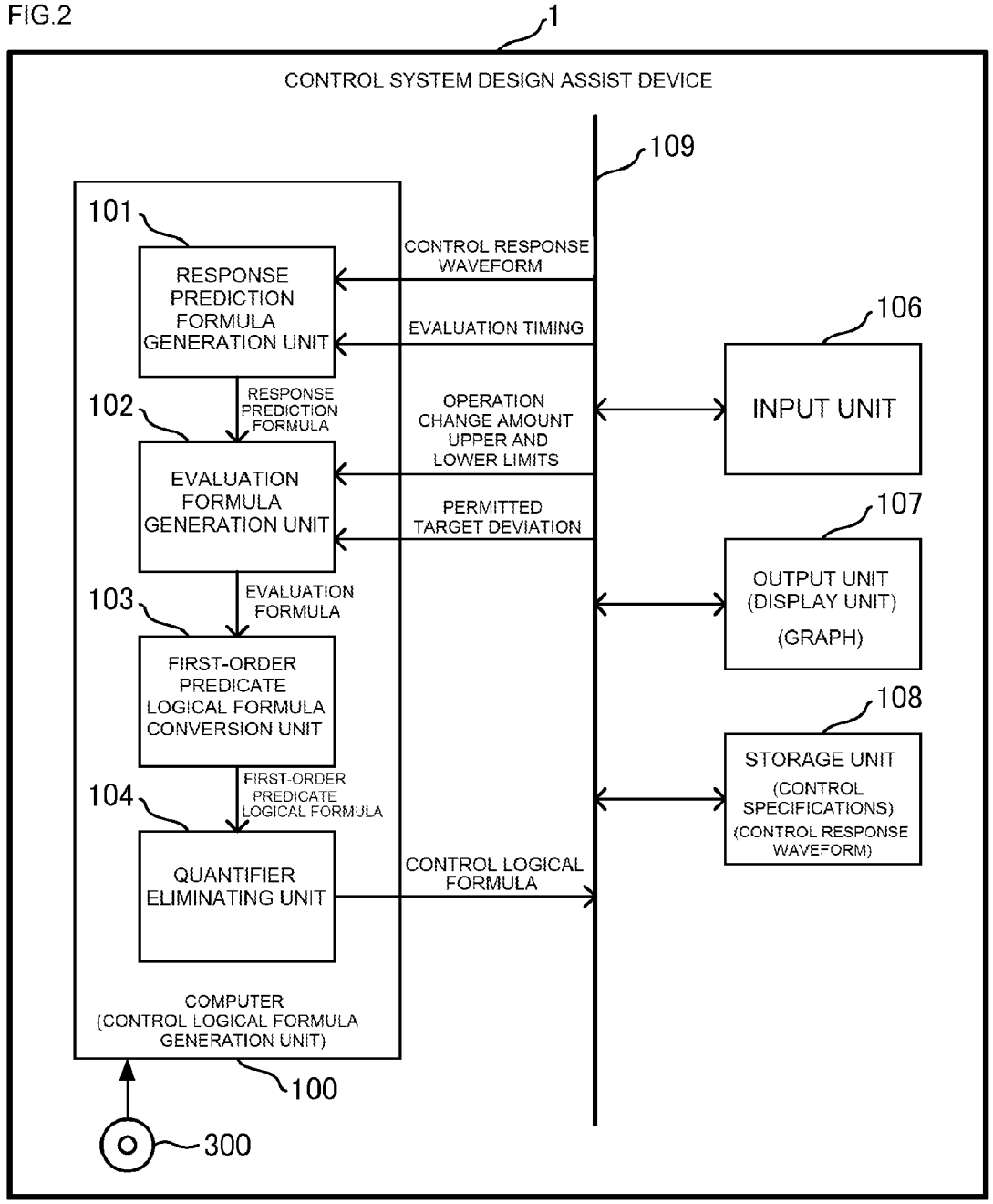
FIG. 2 is a block diagram showing a configuration of a control system design assist device which is constructed on a computer system.

The control system design assist device 1 shown in FIG. 1 can be constructed on a computer system such as that shown in FIG. 2. The control system design assist device 1 shown in FIG. 2 is configured including a response prediction formula generation unit 101, an evaluation formula generation unit 102, a first-order predicate logical formula conversion unit 103, a quantifier eliminating unit 104, an input unit 106, an output unit (display unit) 107 and a storage device 108, which are interconnected with one another via a bus 109. The functions of the control system design assist device 1 can be realized by a computer (control logical formula generation unit) 100 which is provided with the input unit 106, the output unit 107, the storage unit 108 and the bus 109.

(Operation of Control System Design Assist Device)

Below, the operation of the control system design assist device according to a present embodiment is described with reference to FIG. 5 through FIG. 18, as appropriate.

The assistance in the design of a control system performed by the control system design assist device 1 involves: a response prediction formula generation process performed by the response prediction formula generation unit 101, an evaluation formula generation process performed by the evaluation formula generation unit 102, a first-order predicate logical formula conversion process performed by the first-order predicate logical formula conversion unit 103, a quantifier elimination process performed by the quantifier eliminating unit 104, and a display process performed by the display unit 107. As described above, the functions of the control system design assist device 1 can be achieved by the computer 100. For example, the response prediction formula generation process, evaluation formula generation process, first-order predicate logical formula conversion process, quantifier elimination process and display process can be achieved by executing a control system design assist program in the computer 100. The computer 100 may execute the control system design assist program by reading out a control system design assist program stored on a storage medium, such as a CD-ROM or DVD, etc. which is configured so as to be readable by the computer 100, or may acquire the control system design assist program from another computer (not illustrated) which is connected communicably and execute the same.

Figure 5:
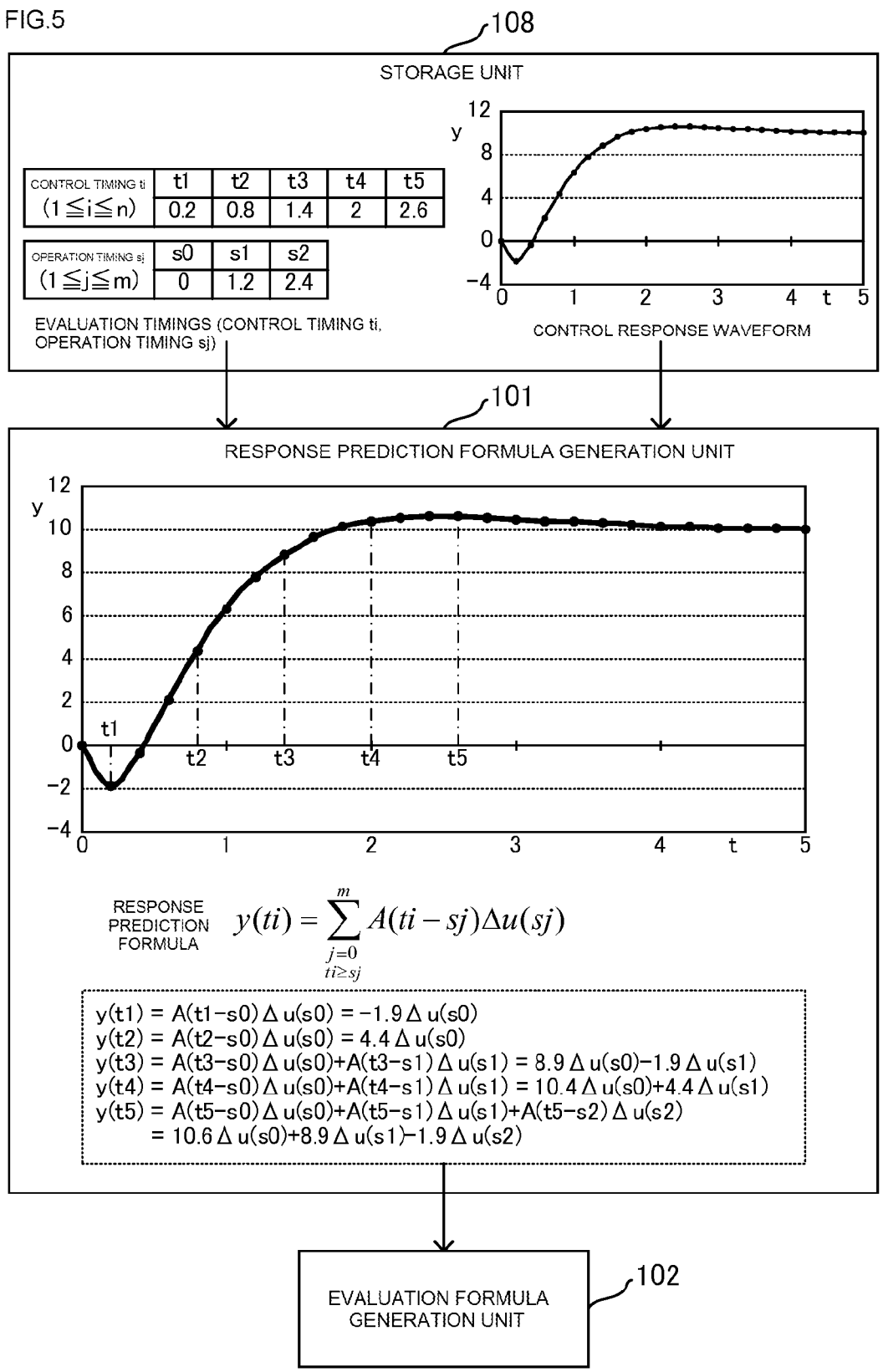
FIG. 5 is a diagram illustrating the operation of a response prediction formula generation unit 101.

In the response prediction formula generation process, as shown in FIG. 5, a response prediction formula is generated on the basis of a control response waveform and an evaluation timing (control timing ti; operation timing sj). The response prediction formula is a formula for predicting the control amount variation value y(ti) at each control timing ti, using the operation change amount $\Delta u(sj)$ at each operation timing sj, and corresponds to the compulsory response in Non-Patent Document 2 and/or the "effect of future moves" in Non-Patent Document 3. More specifically, the response prediction formula is expressed as indicated in Formula (3) below, when the time response (step response, etc.) indicated by the control response waveform is taken as y=A(t).

[Expression 3]

$$y(ti) = \sum_{\substack{j=0 \\ ti \geq sj}}^{m} A(ti-sj)\Delta u(sj) \quad (3)$$

Here, an example of a response prediction formula based on the examples of the control response waveform and evaluation timings indicated in FIG. 4 is shown within the region of the dotted lines in FIG. 5.

Figure 6:
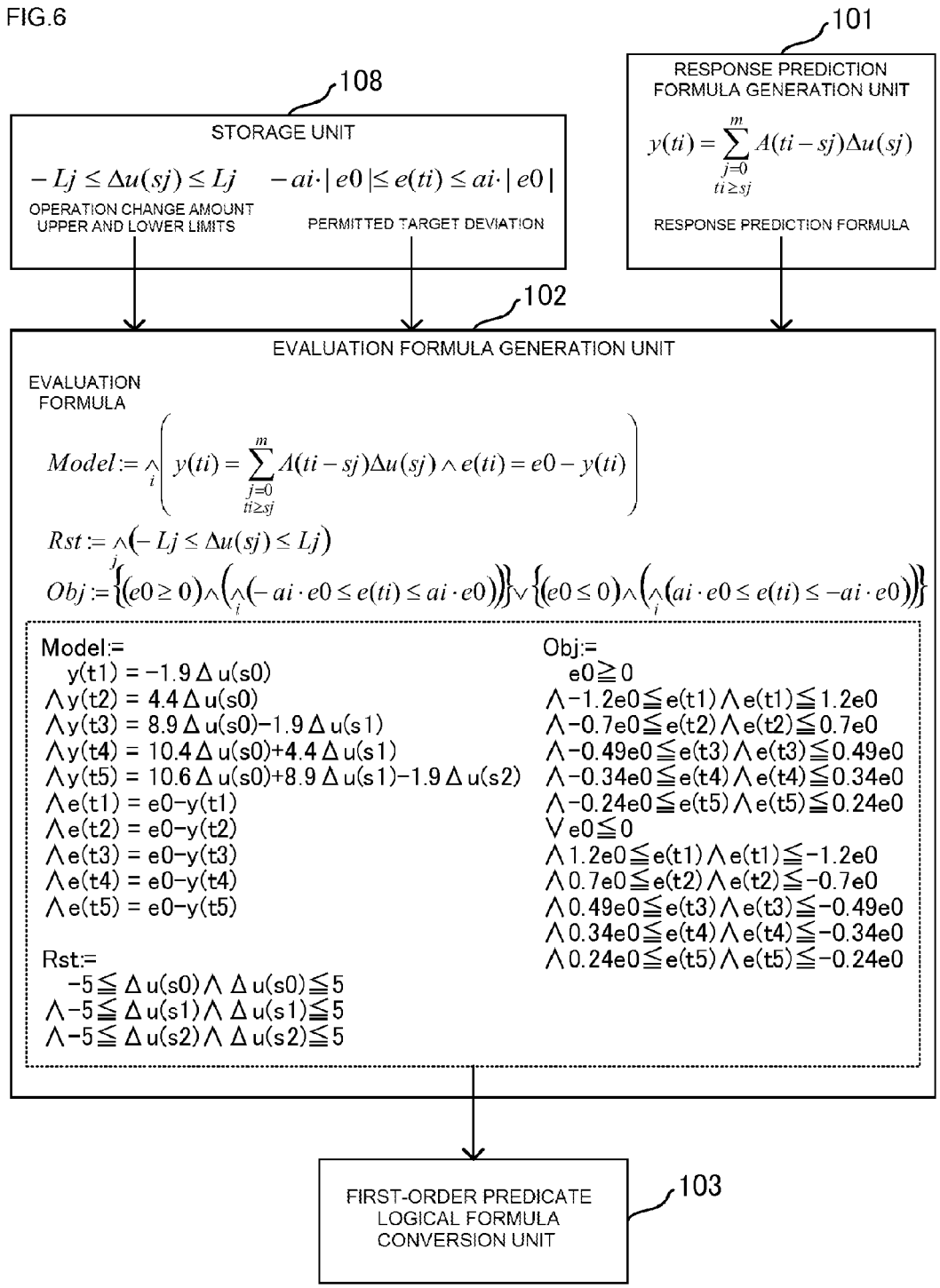
FIG. 6 is a diagram illustrating the operation of an evaluation formula generation unit 102.

In the evaluation formula generation process, as shown in FIG. 6, a first evaluation formula Model, a second evaluation formula Rst, and a third evaluation formula Obj, which correspond respectively to the response prediction formula, the operation change amount upper and lower limits, and the permitted target deviation, are generated on the basis thereof.

The first evaluation formula Model is a formula which expresses the target deviation e(ti) at each control timing ti as a logical formula, and this logical formula expresses a prediction model for control. More specifically, the first evaluation formula Model is expressed as indicated in Formula (4) below, on the basis of the response prediction formula and the current value e0 of the target deviation.

[Expression 4]

$$\text{Model} := \bigwedge_i \left( y(ti) = \sum_{\substack{j=0 \\ ti \geq sj}}^{m} A(ti-sj)\Delta u(sj) \wedge e(ti) = e0 - y(ti) \right) \quad (4)$$

Here, an example of the first evaluation formula Model based on the example of the response prediction formula shown in FIG. 5 is illustrated inside the region of the dotted lines in FIG. 6.

The second evaluation formula Rst is a formula which expresses the operation change amount upper and lower limits which are expressed as indicated in Formula (1) above, as a logical formula, and this logical formula expresses a constraint condition for the operation change amount $\Delta u(sj)$ at each operation timing sj. More specifically, the second evaluation formula Rst is expressed as indicated in Formula (5) below.

[Expression 5]

$$Rst := \bigwedge_j (-Li \leq \Delta u(sj) \leq Lj) \quad (5)$$

Here, an example of the second evaluation formula Rst based on the example of the operation change amount upper and lower limits shown in FIG. 4 is illustrated inside the region of the dotted lines in FIG. 6.

The third evaluation formula Obj is a formula which expresses the permitted target deviation that is expressed as indicated in Formula (2) above, as a logical formula, and this logical formula expresses a constraint condition for the target deviation e(ti) at each control timing ti. More specifically, the third evaluation formula Obj is expressed as indicated in Formula (6) below, by removing the absolute value terms in Formula (2).

[Expression 6]

$$Obj := \left\{ (e0 \geq 0) \wedge \left( \bigwedge_i (-ai \cdot e0 \leq e(ti) \leq ai \cdot e0) \right) \right\} \quad (6)$$
$$\vee \left\{ (e0 \leq 0) \wedge \left( \bigwedge_i (ai \cdot e0 \leq e(ti) \leq -ai \cdot e0) \right) \right\}$$

Here, an example of the third evaluation formula Obj based on the example of the permitted target deviation shown in FIG. 4 is illustrated inside the region of the dotted lines in FIG. 6.

Figure 7:
FIG. 7 is a diagram illustrating the operation of a first-order predicate logical formula conversion unit 103.

In the first-order predicate logical formula conversion process, a logical product is obtained by joining the first evaluation formula Model, the second evaluation formula Rst, and the third evaluation formula Obj in use of the connective ($\wedge$), and converting the same to a first-order predicate logical formula by attaching a quantifier to a portion of the variables. In the present embodiment, as shown in FIG. 7, a formula which finds the logical product of the first to third evaluation formulas (Model $\wedge$ Rst $\wedge$ Obj) is converted into a (first) first-order predicate logical formula $\psi$ in which the existential quantifier ($\exists$) is attached to the variables apart from the current value e0 of the target deviation and the operation change amount Δu(s0) at the first operation timing s0. More specifically, the first-order predicate logical formula ψ is expressed as indicated by Formula (7) below, by attaching the existential qualifier (∃) to the variables Δu(s1), . . . , Δu(sm), y(t1), . . . , y(tn), e(t1), . . . , e(tn), in the formula (Model∧Rst∧Obj).

[Expression 7]

$$\psi := \exists \Delta u(s1) \exists \Delta u(s2) \ldots \exists \Delta u(sm) \\ \exists y(t1) \exists y(t2) \exists y(t3) \ldots \exists y(tn) \\ \exists e(t1) \exists e(t2) \exists e(t3) \ldots \exists e(tn) \\ (Model \wedge Rst \wedge Obj)$$

(7)

The sequence of the variables to which the existential qualifier (∃) is attached in the first-order predicate logical formula ψ can be changed, provided that the logical meaning is not altered. For instance, the sequence does not have to be fixed explicitly, as indicated in Formula (8) below.

[Expression 8]

$$\psi := \exists \Delta u(s1)(\exists \Delta u(s2) \ldots (\exists \Delta u(sm) \\ (\exists y(t1)(\exists y(t2)(\exists y(t3) \ldots (\exists y(tn) \\ (\exists e(t1)(\exists et2)(\exists e(t3) \ldots (\exists e(tn) \\ ((Model \wedge Rst \wedge Obj) \\ )) \ldots )))) \ldots )))) \ldots )$$

(8)

Here, an example of the first-order predicate logical formula ψ according to Formula (8) which is based on the examples of the first evaluation formula Model, the second evaluation formula Rst and the third evaluation formula Obj shown in FIG. 6 is illustrated inside the region of the dotted lines in FIG. 7.

Figure 8:
FIG. 8 is a diagram illustrating the operation of a quantifier eliminating unit 104.

In the quantifier elimination process, the variables to which the existential quantifier (∃) has been attached in the first-order predicate logical formula ψ are eliminated to generate a logically equivalent control logical formula. In the present embodiment, as shown in FIG. 8, a control logical formula φ(e0, Δu0) indicating the relationship between the current value e0 of the target deviation and the operation change amount Δu0≡Δu(s0) at the operation timing s0 is generated. A commonly known algorithm, such as the QE (Quantifier Elimination) algorithm in Non-Patent Document 5, for example, can be used for the quantifier elimination process. Here, a (portion of) an example of the control logical formula φ(e0 Δu0) based on the example of the first-order predicate logical formula ψ shown in FIG. 7 is illustrated inside the region of the dotted lines in FIG. 8.

Figure 9:
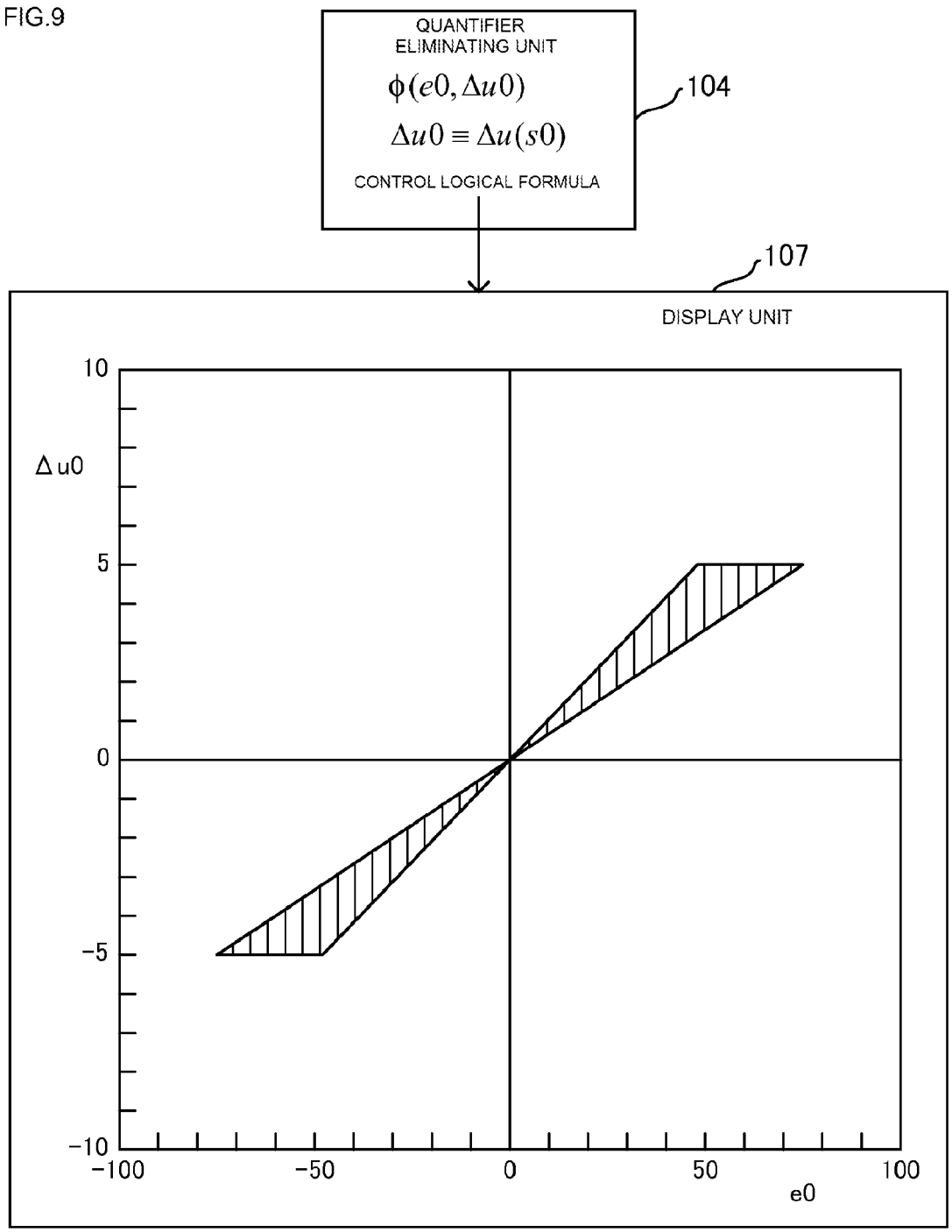
FIG. 9 is a diagram showing one example of a graph displayed on a display unit 107.

In the display process, a graph of the control logical formula φ(e0,Δu0) is displayed on the display unit 107. Here, FIG. 9 shows an example of a graph which is displayed on the display unit 107 on the basis of the example of the control logical formula φ(e0,Δu0) shown in FIG. 8.

In this way, by plotting the region in which the control logical formula φ(e0,Δu0) is established, in an orthogonal coordinates system in which the current value e0 of the target deviation is represented by the horizontal axis and the operation change amount Δu0 at the operation timing s0 is represented by the vertical axis, it is possible to create a visual depiction of the region of the (e0,Δu0) coordinates system that satisfies the control specifications. Since high computing performance is required when a complicated control logical formula φ(e0,Δu0) is used directly in the control system as in the example shown in FIG. 8, a designer can create a new, more simple (less expensive) control logical formula within the range of the plotted region.

For example, if the current value of the control amount Y matches the target value r and the current value of the target deviation is e0=0, then there is no need to change the operation amount u and the operation change amount becomes Δu0=0, and therefore it is possible to create and use a control logical formula which expresses a line segment passing through the point of origin (0,0). A control logical formula of this kind can be created easily by using a computer, or the like, to select one point other than the point of origin contained in the region of the control logical formula φ(e0,Δu0), and creating the control logical formula on the basis of a first-order function (straight line) passing through that point and the point of origin, and the constraint condition for the operation change amount Δu0.

Figure 10:
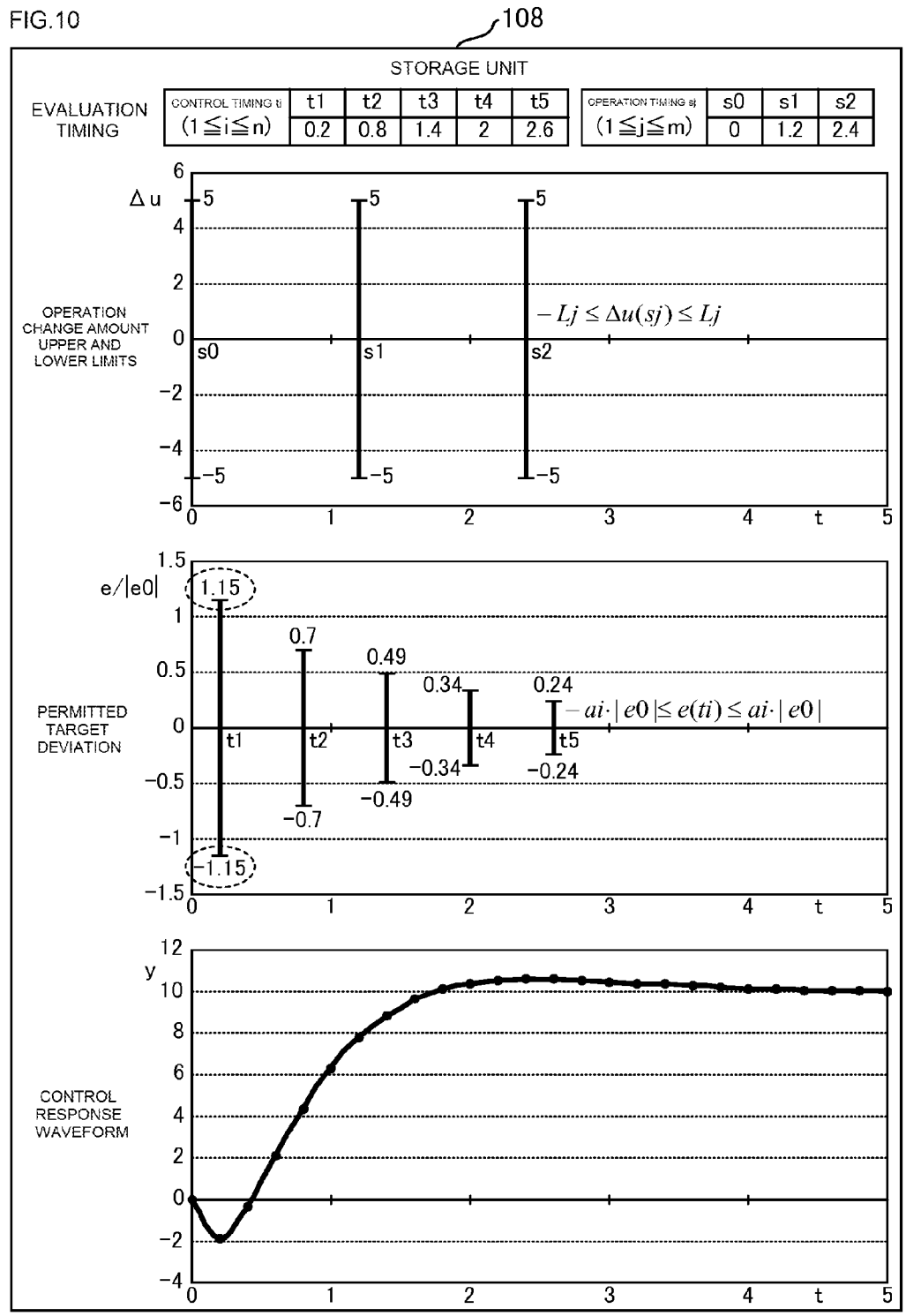
FIG. 10 is a diagram illustrating a further example of control specifications and a control response waveform stored in the storage unit 108.
Figure 11:
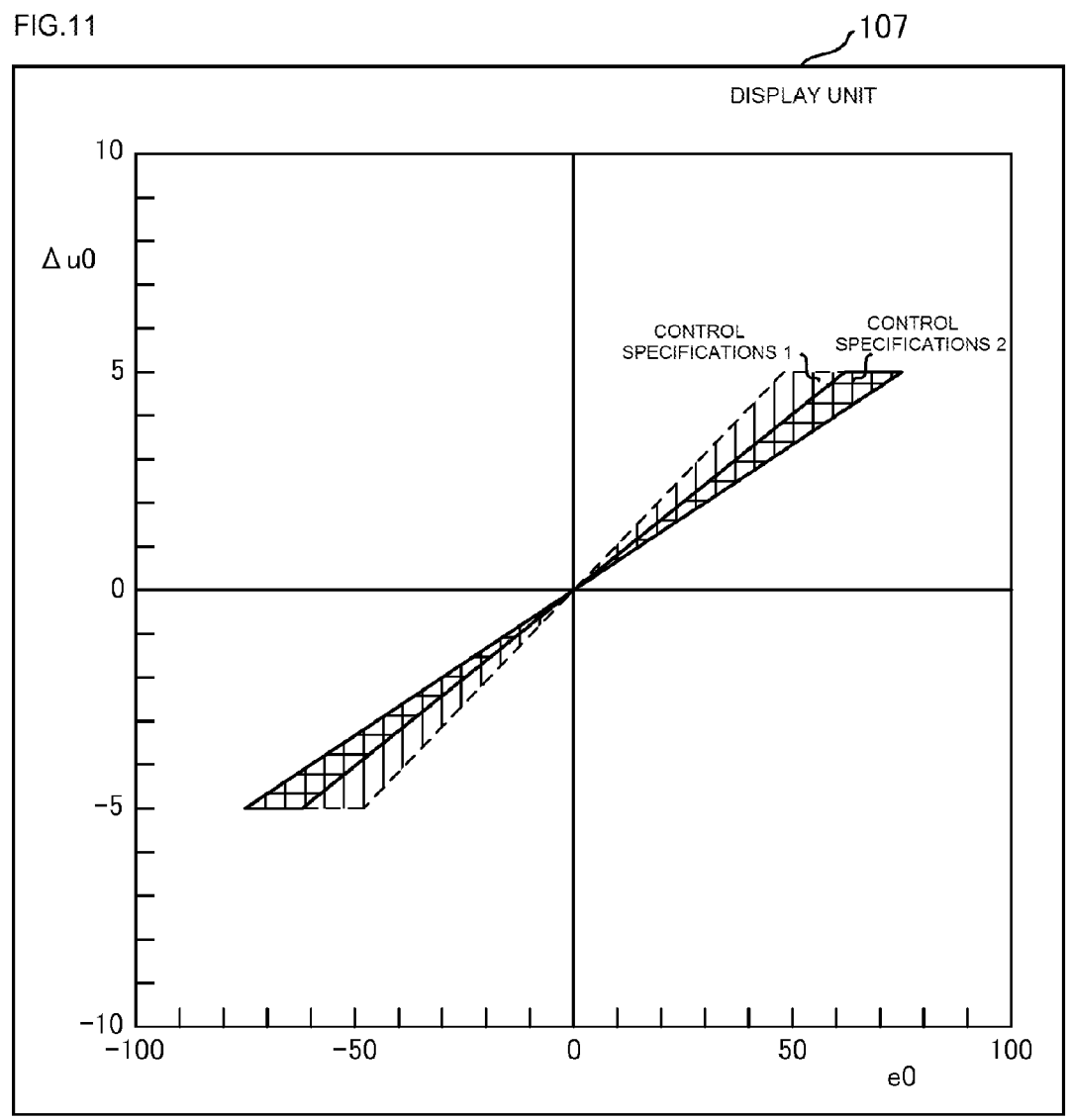
FIG. 11 is a diagram showing a further example of a graph displayed on the display unit 107.

If there are multiple sets of control specifications, then a control logical formula may be generated in a similar fashion for each set of control specifications, and these control logical formulas may be displayed on the same graph. In this respect, FIG. 10 shows an example of control specifications (called control specifications 2 below) in which the permitted target deviation at the control timing t1 is reduced to a1=1.15, from the value of a1=1.2 in the example of the control specifications shown in FIG. 4 (called control specifications 1 below), with the object of avoiding undershooting due to inverse response. Moreover, FIG. 11 shows an example in which the region of the control logical formula which satisfies control specifications 1 and the region of the control logical formula which satisfies control specifications 2 are displayed on the same graph. When the control specifications 2 are satisfied, then the control specifications 1 are always satisfied as well, and therefore in FIG. 11, the region of the control specifications 2 is a portion of the region of the control specifications 1.

In this way, by displaying the regions of the control logical formulas which satisfy respective control specifications, on the same graph, in respect of a plurality of control specifications, a designer is able to design a control system while investigating whether or not control based on stricter control specifications is possible. If control is not possible as a result of making the control specifications stricter, then there is no solution in the quantifier elimination process, and no control logical formula is generated, or a control logical formula containing contradictions is generated, and therefore the region of the relevant control specifications is not displayed in either of these cases.

Figure 12:
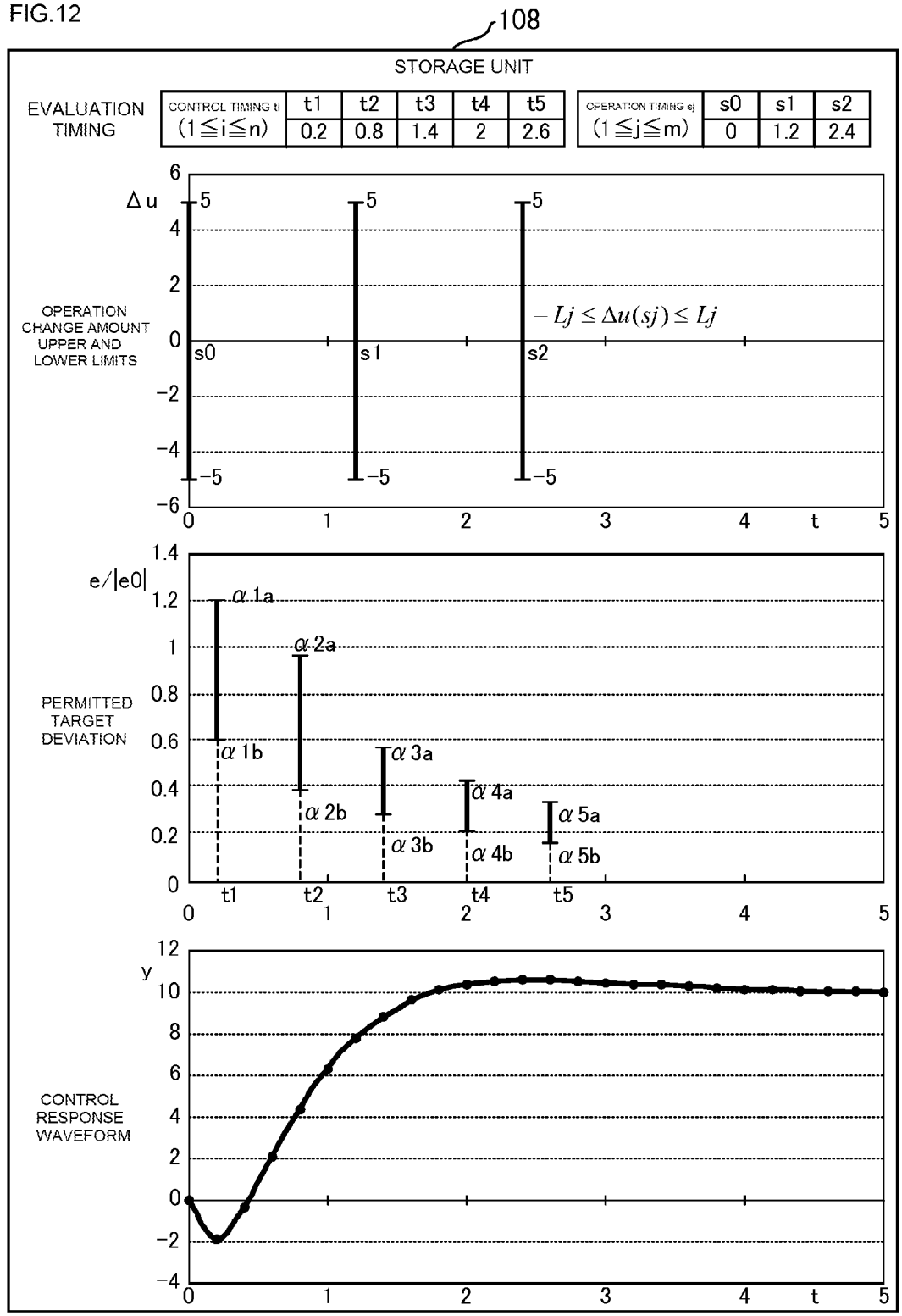
FIG. 12 is a diagram illustrating one example of control specifications and a control response waveform stored in the storage unit 108.

Furthermore, the control system design assist device 1 according to the present embodiment may generate control logical formulas using control specifications such as those shown in FIG. 12, for example, (called control specifications 3 below), and may display these control logical formulas on the graph.

In the control specifications 3, the approach to the permitted target deviation is different to that in the control specifications 1 and/or the control specifications 2. More specifically, in the case of the control specifications 1 and/or control specifications 2, the permitted target deviation is defined on the basis of the absolute value |e0| of the current value e0 of the target deviation, regardless of the sign thereof, but in the case of the control specifications 3, the permitted target deviation is defined so that a constraint is applied on the basis of the sign of the current value e0 of the target deviation.

For example, if the sign of the current value e0 of the target deviation is positive, then the permitted target deviation is defined in such a manner that the value of the target deviation e(ti) at each control timing ti is made smaller, while still having a positive value. Similarly, if the sign of the current value e0 of the target deviation is negative, then the permitted target deviation is defined in such a manner that the value of the target deviation e(ti) at each control timing ti is made smaller, while still having a negative value.

According to a mode of this kind, reversal of the sign of the target deviation between positive and negative is prevented, and a control logical formula which enables a smoother control operation can be generated.

The permitted target deviation in the control specifications 3 is expressed as indicated in Formulas (9) and (10) below, for example.

[Expression 9]

$$\alpha_{ib}e0 \leq e(ti) \leq \alpha_{ia}e0 (e0 \geq 0, \alpha_{ia} \geq \alpha_{ib} \geq 0, i=1,2 \ldots) \quad (9)$$

[Expression 10]

$$\alpha_{ia}e0 \leq e(ti) \leq \alpha_{ib}e0 (e0 \leq 0, \alpha_{ia} \geq \alpha_{ib} \geq 0, i=1,2 \ldots) \quad (10)$$

Therefore, when the sign of e0 is positive, then e(ti) can be limited to a positive region in the range where $\alpha_{ia}$, $\alpha_{ib}$, e0 are positive, and when the sign of e0 is negative, then e(ti) can be limited to a negative region in the range where $\alpha_{ia}$, $\alpha_{ib}$ are positive and e0 is negative.

Figure 13:
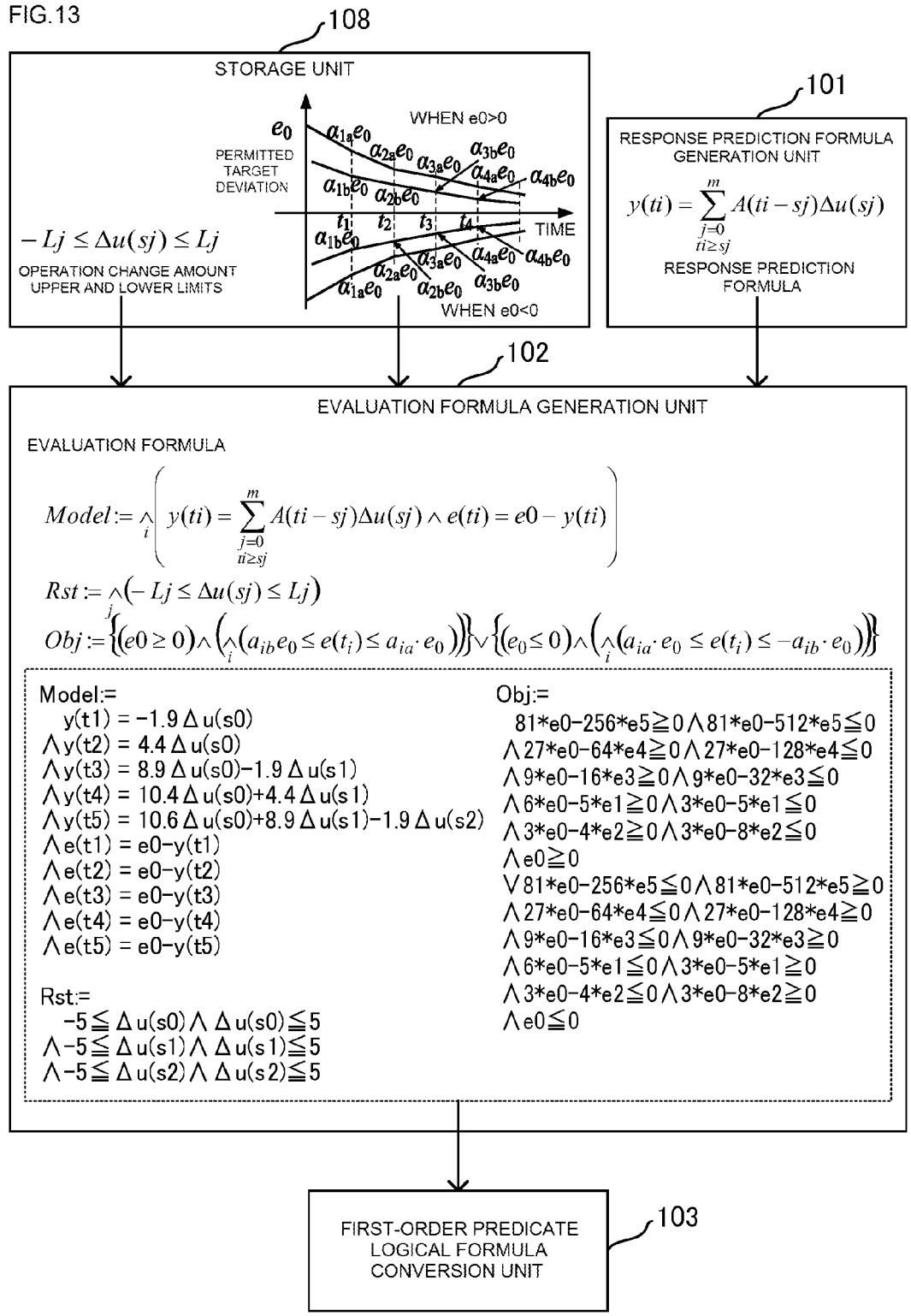
FIG. 13 is a diagram illustrating the operation of the evaluation formula generation unit 102.

Furthermore, FIG. 13 shows the evaluation formula which is generated by the evaluation formula generation unit 102 when the control specifications 3 are used. As shown in FIG. 13, in the case of the control specifications 3, the first evaluation formula Model and the second evaluation formula Rst are the same as the control specifications 1 and the control specifications 2, but the third evaluation formula Obj is different.

Moreover, when the control specifications 3 are used, the contents of the processing carried out by the first-order predicate logical formula conversion unit 103 and the quantifier eliminating unit 104 are similar to the control specifications 1 and/or the control specifications 2.

Figure 14:
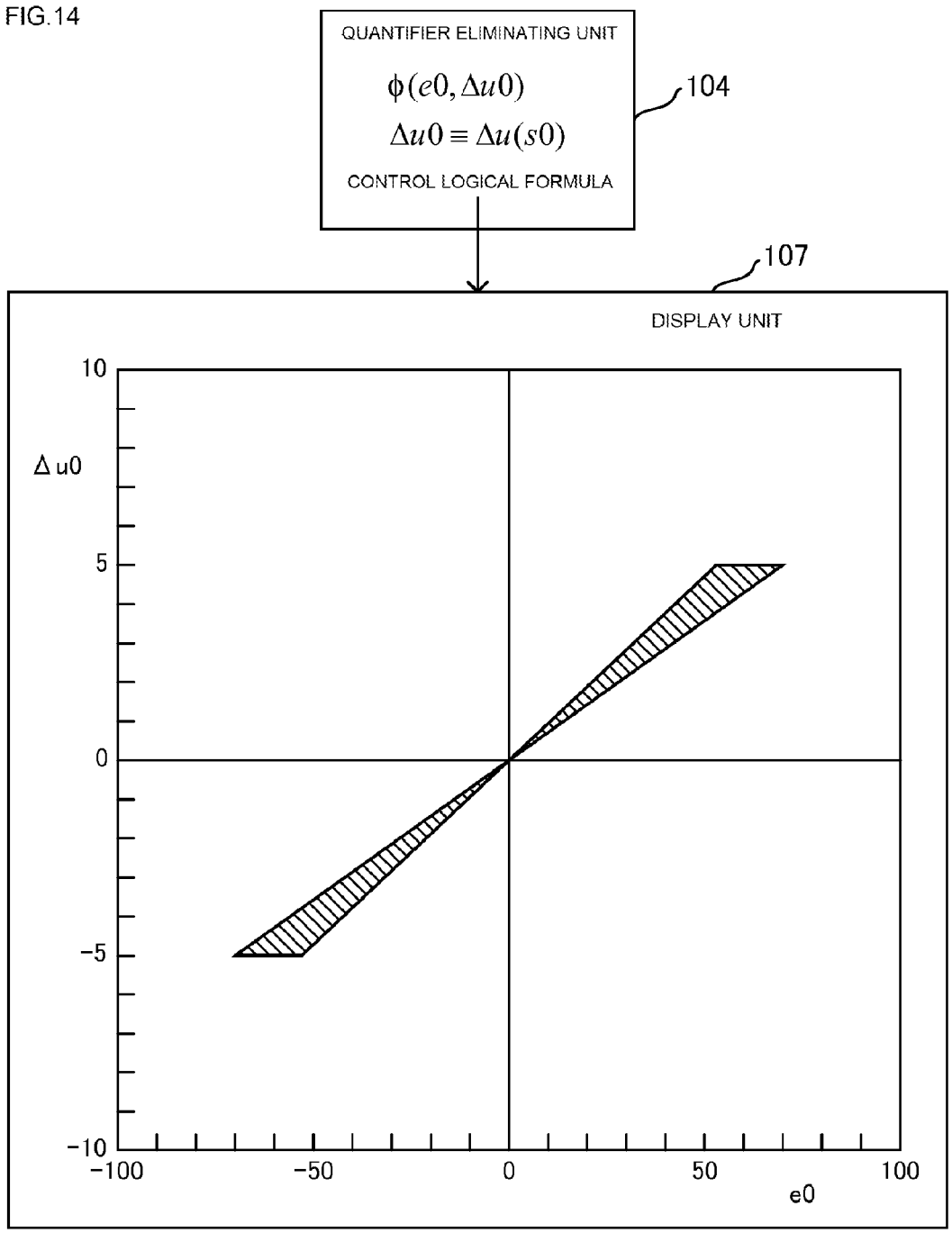
FIG. 14 is a diagram showing one example of a graph displayed on the display unit 107.
Figure 15:
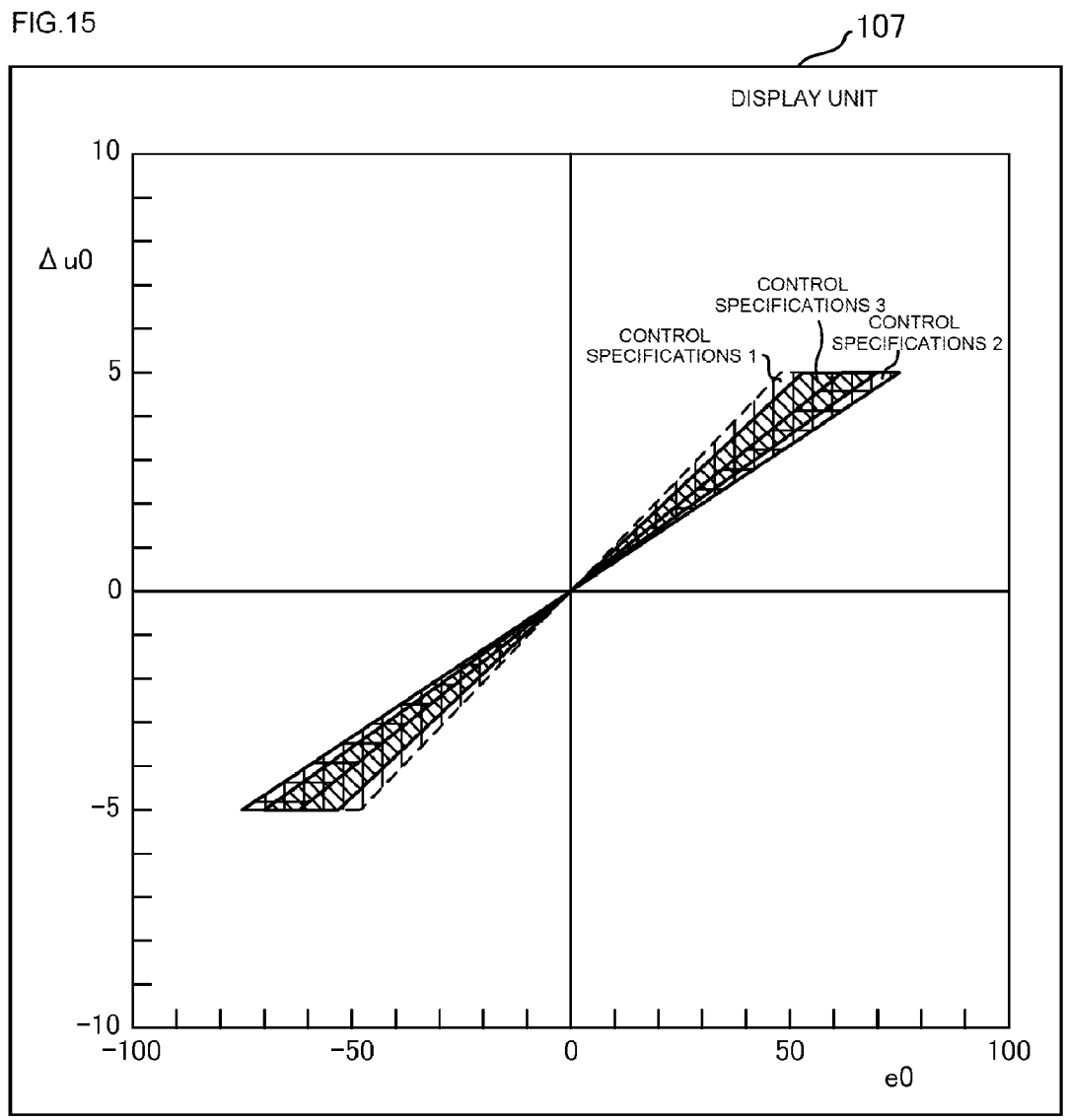
FIG. 15 is a diagram showing a further example of a graph displayed on the display unit 107.

FIG. 14 shows a situation where the graph of the control logical formula $\phi(e0,\Delta u0)$ of the control specifications 3 which is generated in this way is displayed by the display unit 107. Furthermore, FIG. 15 shows an example in which the regions of the control logical formulas that satisfy the control specifications 1, the control specifications 2 and the control specifications 3 are displayed on the same graph.

In this way, by displaying the regions of the control logical formulas which satisfy respective control specifications, on the same graph, in respect of a plurality of control specifications, a designer is able to design a control system while investigating whether or not control based on stricter control specifications is possible.

Furthermore, the display unit 107 may further display a graph other than a control logical formula $\phi(e0,\Delta u0)$ indicating the relationship between the current value e0 of the target deviation and the operation change amount $\Delta u0$. For example, in the first-order predicate logical formula conversion process, it is possible to generate a logical formula indicating the relationship between any two variables, by changing the combination of the two variables to which the existential quantifier ($\exists$) is not attached, and a graph thereof can be displayed for use as reference information when designing a control system.

Figure 16:
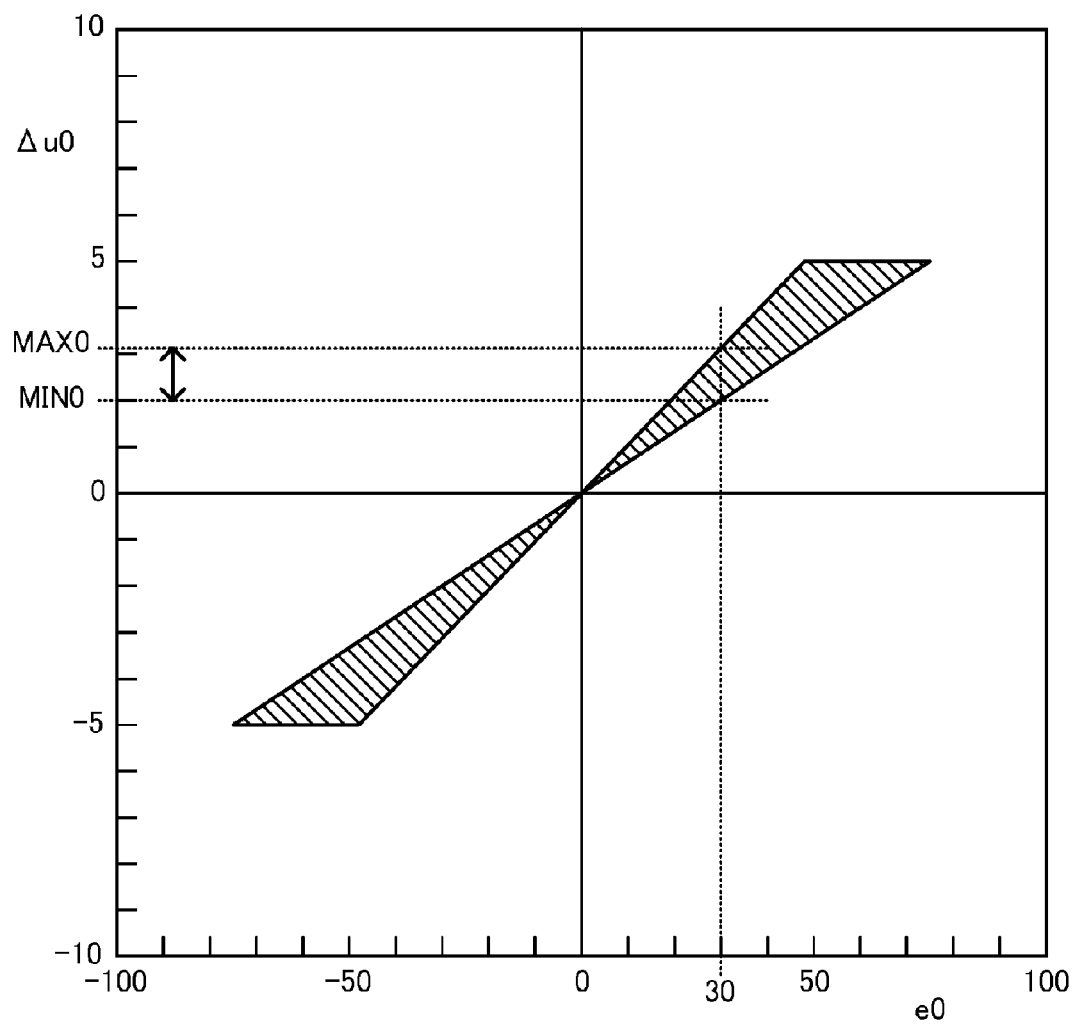
FIG. 16 is a diagram showing a range that can be adopted by an operation change amount Δu0 when the current value e0 of a target deviation is fixed to a particular value.
Figure 17:
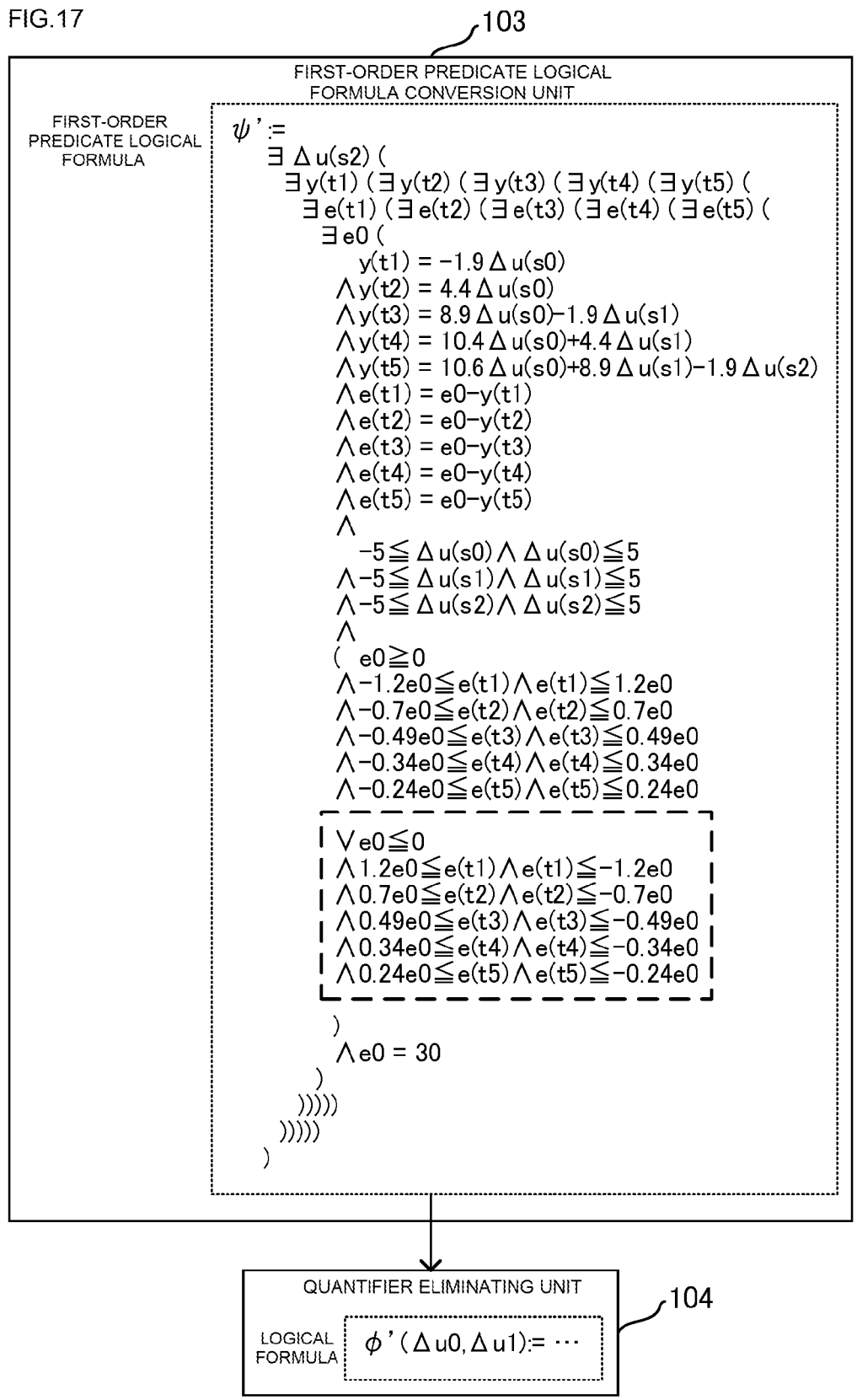
FIG. 17 is a diagram illustrating a further operation of the first-order predicate logical formula conversion unit 103.
Figure 18:
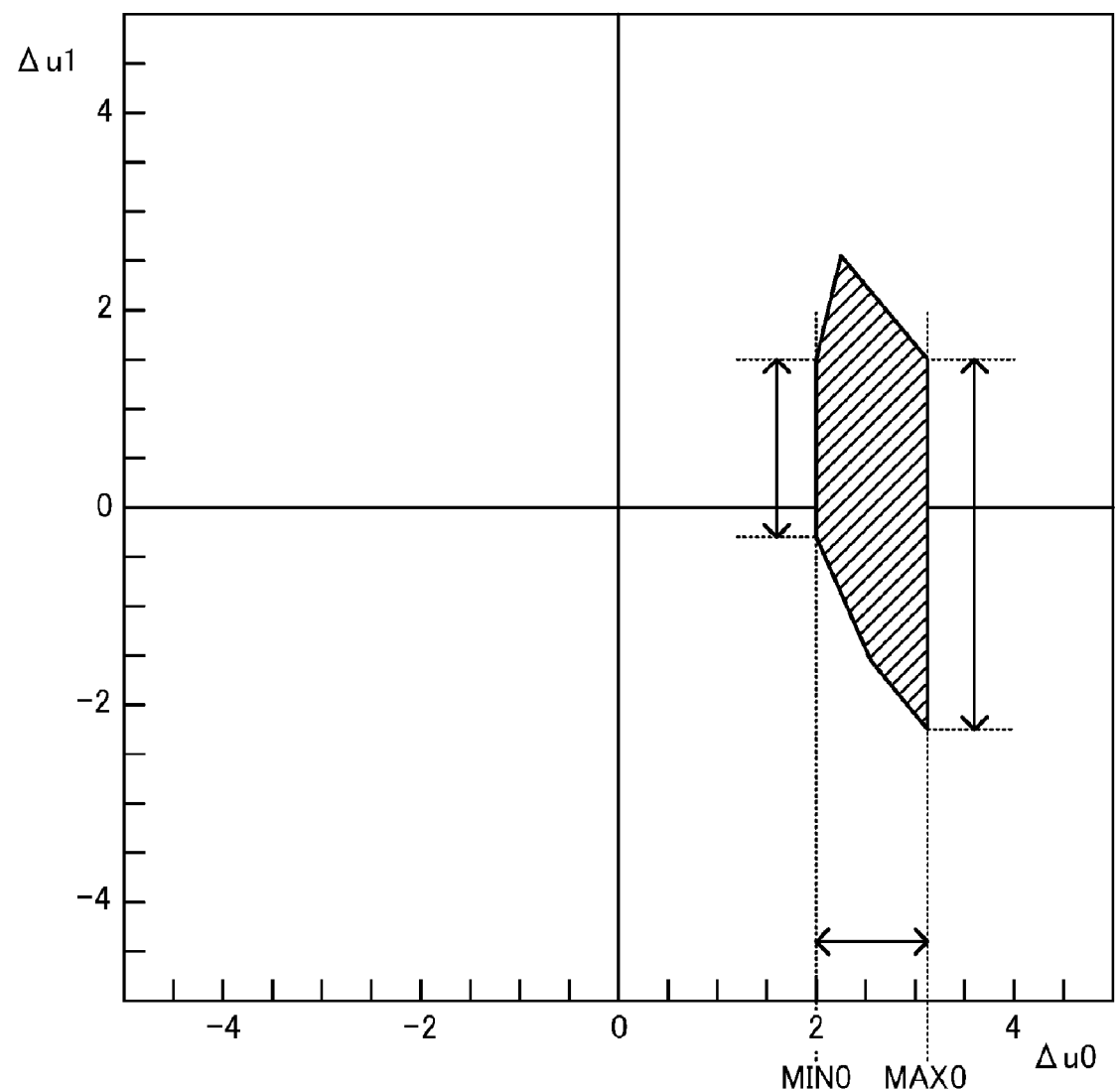
FIG. 18 is a diagram showing yet a further example of a graph displayed on the display unit 107.

Here, FIG. 16 through FIG. 18 show examples of a method wherein a logical formula $\phi'(\Delta u0,\Delta u1)$ indicating a relationship between the operation change amount $\Delta u0$ at the operation timing s0 and the operation change amount $\Delta u1 \equiv \Delta u(s1)$ at the operation timing s1 is generated and a graph thereof is used in designing a control system. FIG. 16 indicates that a range where the operation change amount $\Delta u0$ is $MIN0 \leq \Delta u0 \leq MAX0$ can be obtained when the current value e0 of the target deviation is fixed to a particular value (for example, 30), but does not indicate the relationship with other variables. Thereupon, as shown in FIG. 17, a logical formula $\phi'(\Delta u0,\Delta u1)$ indicating the relationship between the operation change amount $\Delta u0$ and the operation change amount $\Delta u1$ is generated by a first-order predicate logical formula conversion process performed by the first-order predicate logical formula conversion unit 103 and a quantifier elimination process performed by the quantifier eliminating unit 104.

In the first-order predicate logical formula conversion process, a formula deriving the logical product of the first to third evaluation formulas (Model$\land$RSt$\land$Obj) is converted to a (second) first-order predicate logical formula $\psi'$, which is different to the (first) first-order predicate logical formula $\psi$. More specifically, a logical product is derived by further adding a fixed condition (e0=30) for the current value e0 of the target deviation, to the logical product of the first to third evaluation formulas, and the existential quantifier ($\exists$) is attached to the variables other than the operation change amounts $\Delta u(s0)$ and $\Delta u(s1)$, thereby conversion to a first-order predicate logical formula $\psi'$ is implemented. The constraint condition when the current value of the target deviation is e0$\leq$0, which is surrounded by the dash lines in FIG. 17, is not established on account of the fixed condition (e0=30), and therefore may be deleted in advance.

In the quantifier elimination process, variables to which the existential quantifier ($\exists$) has been attached in the first-order predicate logical formula $\psi'$ are eliminated, and a logical formula $\phi'(\Delta u0,\Delta u1)$ indicating the relationship between the operation change amount $\Delta u0$ and the operation change amount $\Delta u1$ is generated. FIG. 18 shows a graph of the region where the logical formula $\phi'(\Delta u0,\Delta u1)$ is established, which is displayed on the display unit 107 in addition to the graph of the control logical formula $\phi(e0,\Delta u0)$.

As shown in FIG. 18, the range that can be adopted by the operation change amount $\Delta u1$ is narrower when $\Delta u0=MIN0$, than when $\Delta u0=MAX$. Consequently, rather than increasing the last control by making the operation change amount $\Delta u0$ larger, reducing the last control by making the operation change amount $\Delta u0$ smaller yields a narrower range that can be adopted subsequently by the operation change amount $\Delta u1$. Furthermore, if a new control logical formula is created, which includes a first-order function passing through the point of origin and a selected point, and constraint conditions for the operation change amount $\Delta u0$, then selecting the point (30, MAX0) yields a narrower range that can be adopted by the operation change amount $\Delta u1$, compared to selecting the point (30, MIN0).

(Configuration of Control Device)

Below, the configuration of the control device 2 which is provided with a control logical formula generated by the control system design assist device 1 will be described with reference to FIG. 19.

Figure 19:
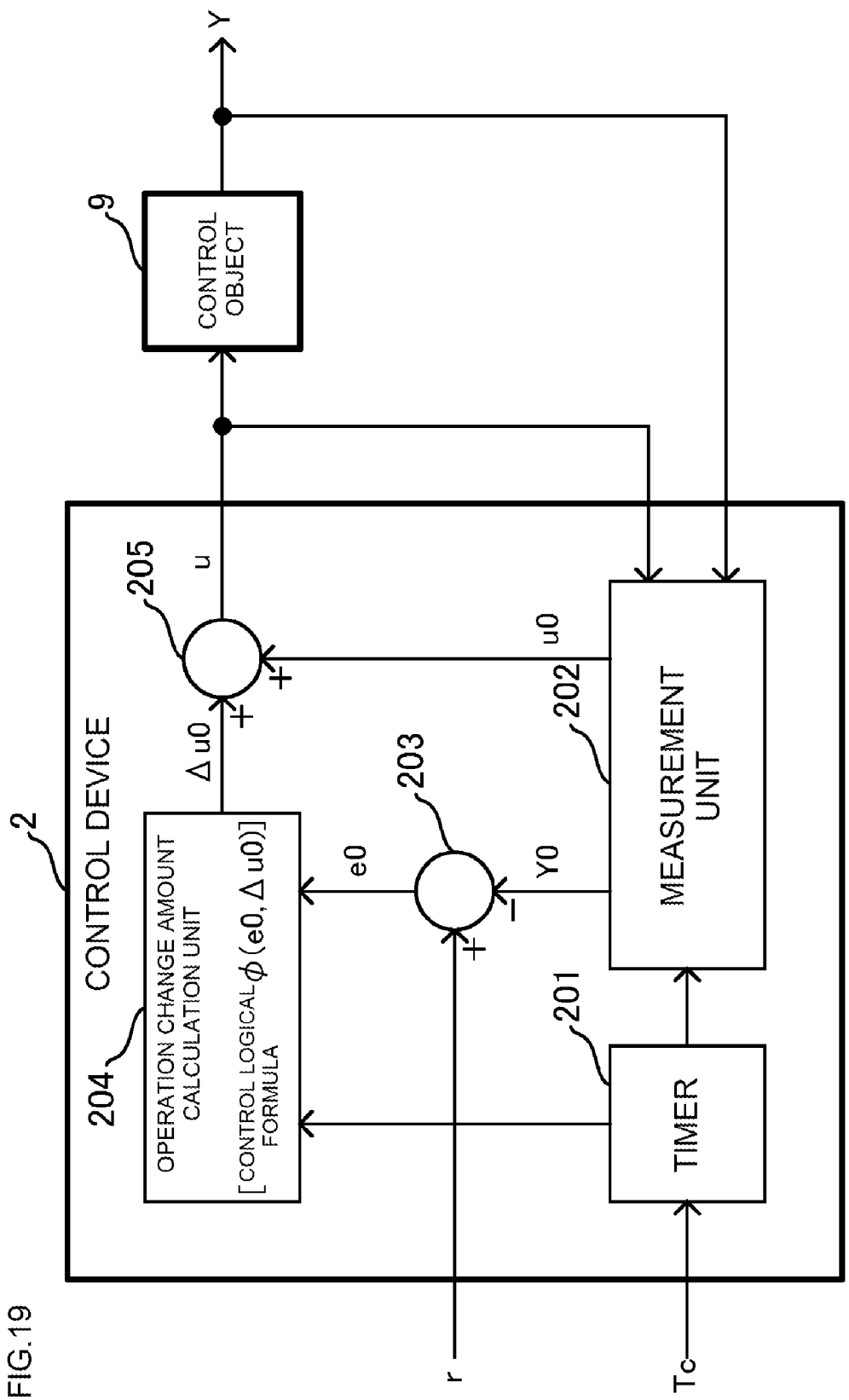
FIG. 19 is a block diagram showing a configuration of a control device provided with a control logical formula which is generated by the control system design assist device.

The control device 2 illustrated in FIG. 19 is a device for controlling a control amount Y of a control object 9 to a target value r, and is configured including a timer 201, a measurement unit 202, a target deviation calculation unit 203, an operation change amount calculation unit 204 and an operation amount updating unit 205.

The timer 201 receives input of a control cycle Tc, and the measurement unit 202 and the operation change amount calculation unit 204 operate at each control cycle Tc, under the control of the timer 201. Furthermore, the measurement unit 202 receives the input of the operation amount u and the control amount Y of the control object, and the measurement unit 202 outputs the measurement value (current value) u0 of the operation amount and the measurement value (current value) Y0 of the control amount. Moreover, the target deviation calculation unit 203 receives input of the measurement value Y0 of the control amount and the target value r thereof, and the target deviation calculation unit 203 outputs the current value e0 of the target deviation.

The operation change amount calculation unit 204 is provided with a control logical formula φ(e0,Δu0) generated by the control system design assist device 1. Furthermore, the operation change amount calculation unit 204 receives input of the current value e0 of the target deviation, and the operation change amount calculation unit 204 outputs the next operation change amount Δu0 (for operation timing s0). The operation amount updating unit 205 receives input of the measurement value u0 of the operation amount and the operation change amount Δu0, and outputs an operation amount u.

(Operation of Control Device)

Below, the operation of the control device 2 is described with reference to FIG. 20 to FIG. 23, as appropriate.

Figure 20:
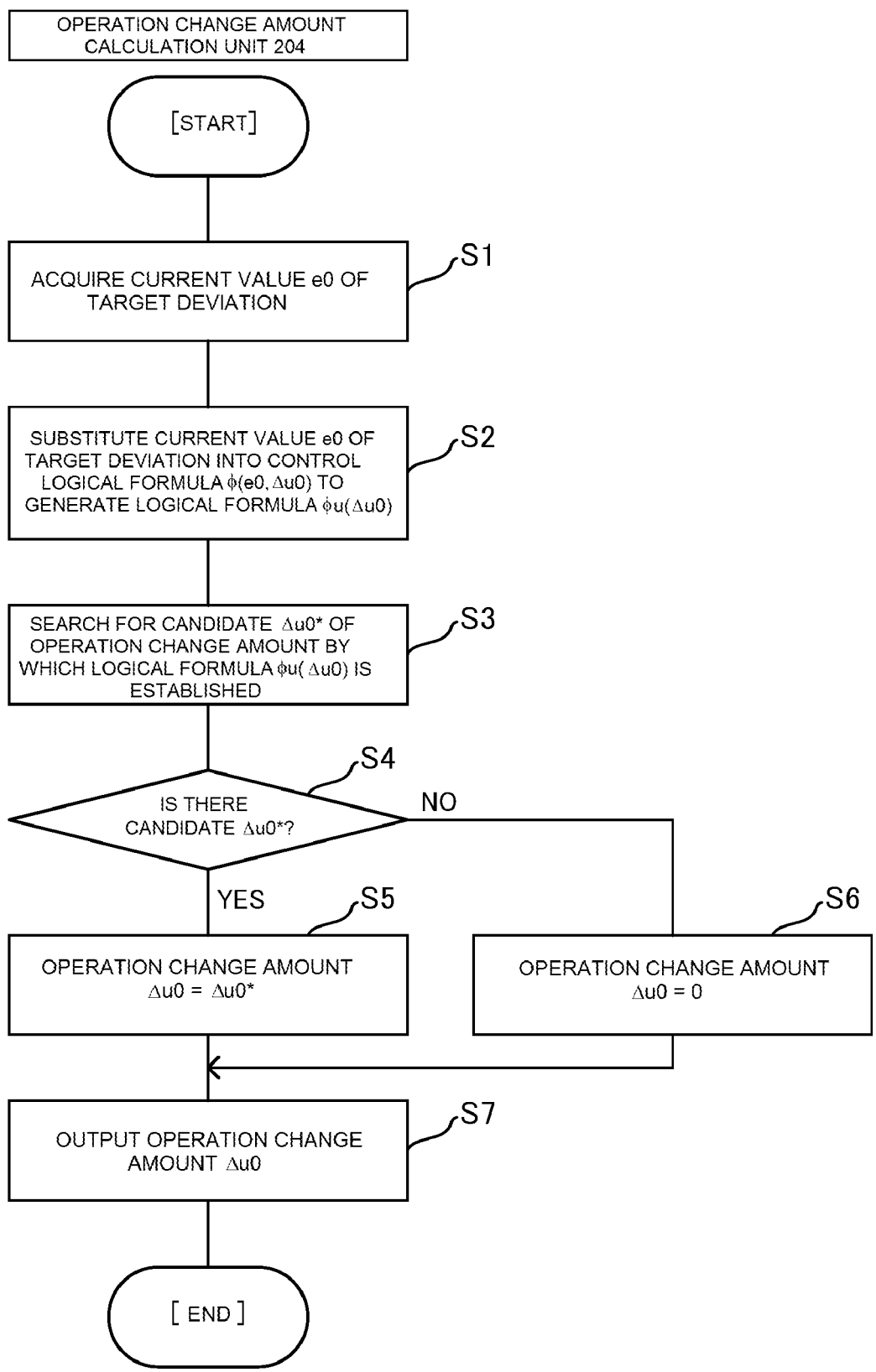
FIG. 20 is a flowchart illustrating the operation of an operation change amount calculation unit 204.

The measurement unit 202 measures the operation amount u and the control amount Y, at each control cycle Tc, and outputs the respective measurement values u0 and Y0. Furthermore, the target deviation calculation unit 203 subtracts the measurement value Y0 of the control amount, from the target value r, and calculates the current value e0 of the target deviation. Moreover, the operation change amount calculation unit 204 calculates the operation change amount Δu0, on the basis of the control logical formula φ(e0,Δu0) and the current value e0 of the target deviation, at each control cycle Tc. FIG. 20 shows the operation of the operation change amount calculation unit 204 at each control cycle.

When the current control cycle is started, for instance, firstly, the current value e0 of the target deviation is acquired (S1). Thereupon, the current value e0 of the target deviation is substituted into the control logical formula φ(e0,Δu0), and a logical formula φu(Δu0) relating only to the operation change amount Δu0 is generated (S2).

Next, a candidate Δu0* for the operation change amount that is established by the logical formula φu(Δu0) is searched for (S3). For example, values are substituted into the logical formula φu(Δu0), while successively increasing or decreasing from a prescribed initial value, in prescribed steps, and are determined to be true or false, and the first value which is determined to be true is set as a candidate Δu0* for the operation change amount. Furthermore, for instance, a candidate Δu0* for the operation change amount may also be searched for by performing a binary search from a prescribed initial value.

Next, when a candidate Δu0* for the operation change amount which establishes the logical formula φu(Δu0) has been found as a result of this search (S4: YES), then the operation change amount Δu0 is set to Δu0=Δu0* (S5), and the operation change amount Δu0 is output (S7). On the other hand, when a candidate Δu0* for the operation change amount which establishes the logical formula φu(Δu0) has not been found as a result of this search (S4: NO), then the operation change amount Δu0 is set to Δu0=0 (S6), and the operation change amount Δu0 is output (S7).

The operation amount updating unit 205 updates the operation amount u by adding the operation change amount Δu0 to the measurement value u0 of the operation amount. In this way, an updated operation amount u is output at each control cycle Tc, on the basis of the control logical formula φ(e0,Δu0), from the control device 2.

Figure 21:
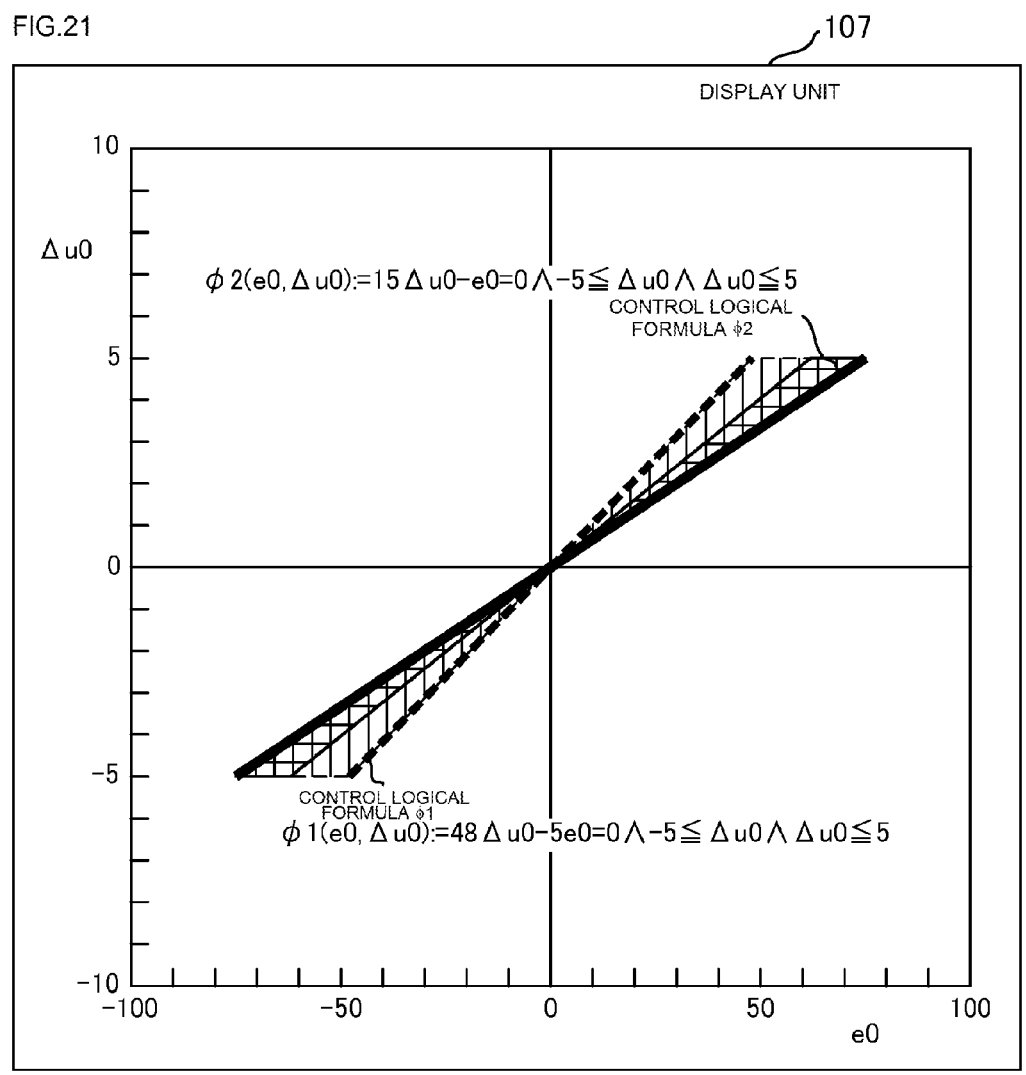
FIG. 21 is a diagram showing one example of control logical formulas $\phi1(e0,\Delta u0)$ and $\phi2(e0,\Delta u0)$ which are created respectively in respect of control specifications 1 and 2.

As stated previously, instead of using the control logical formula φ(e0,Δu0) directly, it is also possible to create and use a simpler control logical formula, in the plotted range of the region of the control logical formula φ(e0,Δu0). Since (e0,Δu0)=(0,0), then by means of the user inputting the coordinate values of any one point (e0,Δu0) within the range of the region of the control logical formula φ(e0,Δu0) displayed on the display unit 107, via an input unit 106 (for instance, a mouse), the computer 100 is able to generate a control logical formula including a first-order function passing through the point of origin and a constraint condition for the operation change amount Δu0. FIG. 21 shows one example of a control logical formula including a first-order function passing through the point of origin and a constraint condition for the operation change amount Δu0, which is newly created within the range of the region of the control logical formula that satisfies the respective control specifications, in respect of the abovementioned control specifications 1 and 2. In the example in FIG. 21, a control logical formula φ1(e0,Δu0) which is indicated by Formula (11) below is created in respect of the control specifications 1.

[Expression 11]

$$\phi1(e0,\Delta u0):=48\Delta u0-5e0=0 \wedge -5\leq \Delta u0 \wedge \Delta u0 \leq 5 \quad (11)$$

Furthermore, a control logical formula φ2(e0,Δu0) which is indicated by Formula (12) below is created in respect of the control specifications 2.

[Expression 12]

$$\phi2(e0,\Delta u0):=15\Delta u0-e0=0 \wedge -5\leq \Delta u0 \wedge \Delta u0 \leq 5 \quad (12)$$

Figure 22:
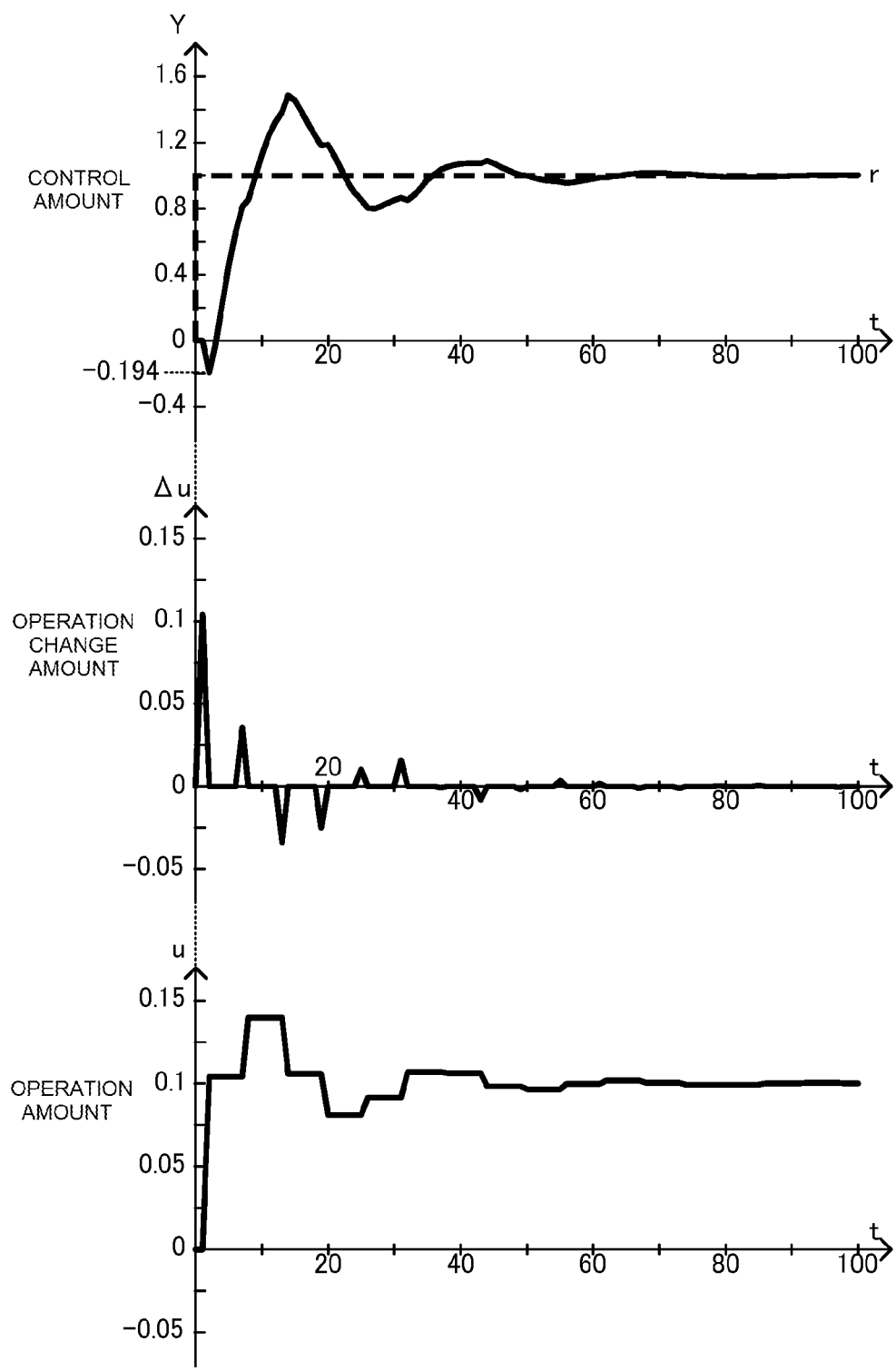
FIG. 22 is a diagram showing one example of the operation of a control device provided with a control logical formula $\phi1(e0,\Delta u0)$.
Figure 23:
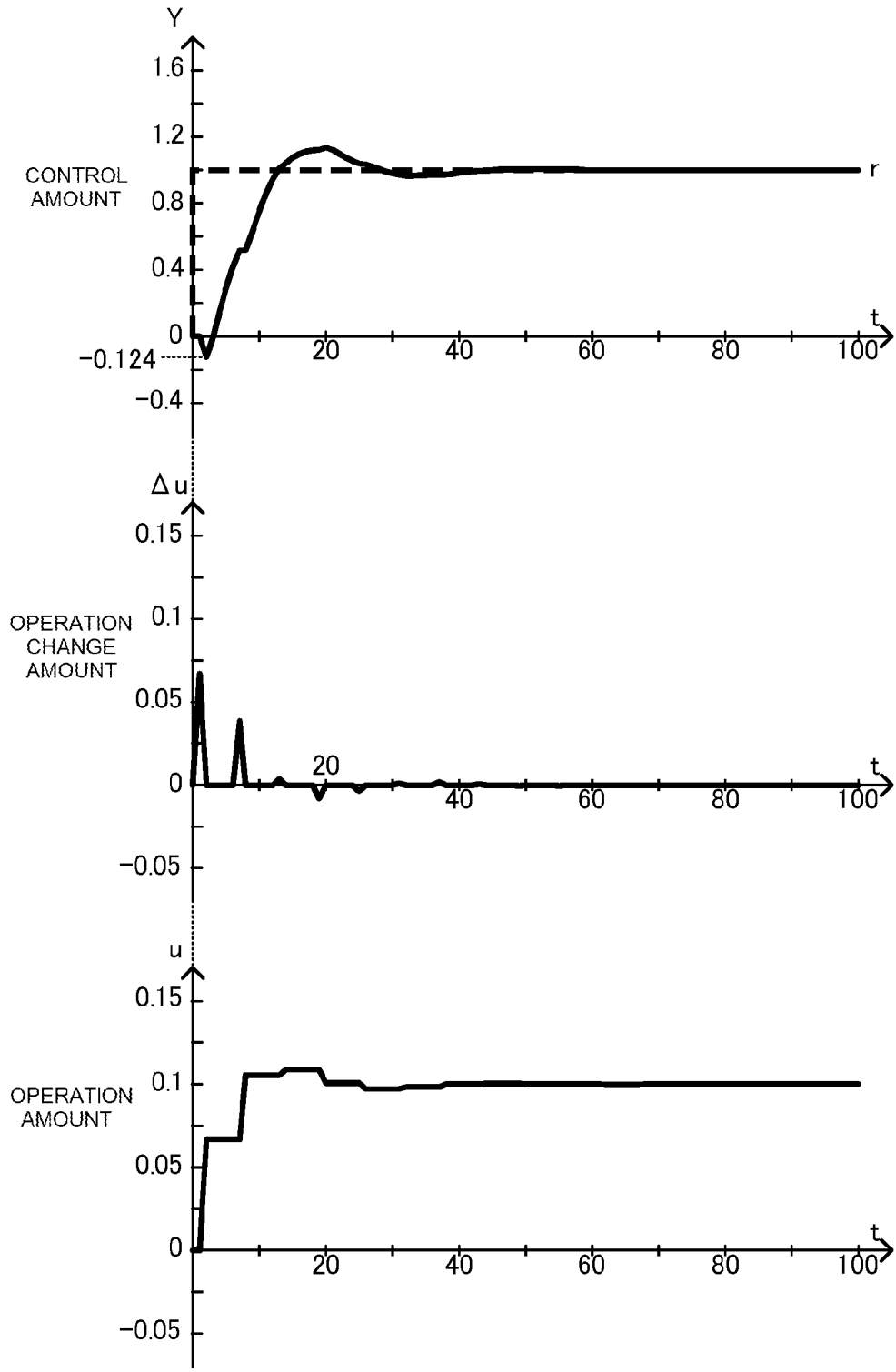
FIG. 23 is a diagram showing one example of the operation of a control device provided with a control logical formula φ2(e0,Δu0)

In this respect, FIG. 22 and FIG. 23 respectively show concrete examples of the operation of a control device 2 which is provided with the control logical formula φ1(e0, Δu0) and the control logical formula φ2(e0,Δu0). FIG. 22 and FIG. 23 show the control amount Y, the operation change amount Δu and the operation amount u when the target value r (dash line) at timing t=0 is changed in a stepped fashion from 0 to 1.

In FIG. 22, for example, at timing t=1, the current value of the target deviation is e0=r−Y0=1, and when this is substituted into the control logical formula φ1(e0,Δu0), then the logical formula φu1(Δu0) relating only to the operation change amount Δu0 which is illustrated in Formula (13) indicated below is obtained.

[Expression 13]

$$\phi u1(\Delta u0):=48\Delta u0-5=0 \wedge -5\leq \Delta u0 \wedge \Delta u0 \leq 5 \quad (13)$$

Moreover, for instance, when values are substituted into the logical formula φu1(Δu0) while successively increasing from an initial value of −10 in steps of 0.1, and are determined to be true (T) or false (F), then

[Expression 14]

$\phi u1(-10) := (48 \cdot (-10) - 5 = 0) \wedge (-5 \leq 10) \wedge (-10 \leq 5) = F \wedge F \wedge T = F$ $\phi u1(-9.9) :=$
$\quad (48 \cdot (-9.9) - 5 = 0) \wedge (-5 \leq 9.9) \wedge (-9.9 \leq 5) = F \wedge F \wedge T = F$ $\vdots$ $\phi u1(-5) := (48 \cdot (-5) - 5 = 0) \wedge (-5 \leq 5) \wedge (-5 \leq 5) = F \wedge T \wedge T = F$ $\vdots$ $\phi u1(0) := (48 \cdot (0) - 5 = 0) \wedge (-5 \leq 0) \wedge (0 \leq 5) = F \wedge T \wedge T = F$ $\phi u1(0.1) := (48 \cdot (0.1) - 5 = 0) \wedge (-5 \leq 0.1) \wedge (0.1 \leq 5) = T \wedge T \wedge T = T$ is derived, and since the candidate $\Delta u0^* = 0.1$ for the operation change amount by which the logical formula $\Delta u1(\Delta u0)$ is established is found, then the operation change amount $\Delta u0 = \Delta u0^* = 0.1$ is output. The first equation in the logical formula $\phi u1(\Delta u0)$ is determined to be true within a range of error of ±0.2, in respect of the 0.1 step width. The updated operation amount $u = u0 + \Delta u0 = 0.1$ is output at timing $t = 2$. Thereafter, in a similar fashion, an updated operation amount u is output each time the control cycle Tc=6, and the control amount Y converges to the target value r.

On the other hand, in the control specifications 2, by reducing the permitted target deviation at the next (control timing t1), from a1=1.2 to a1=1.15, undershooting due to inverse response is suppressed, as shown in FIG. 23.

As shown in FIG. 22 and FIG. 23, in a control device 2 which is provided with the control logical formula $\phi1(e0, \Delta u0)$, the amount of undershoot is 0.194, whereas in the control device 2 which is provided with the control logical formula $\phi2(e0, \Delta u0)$, the amount of undershoot is reduced to 0.124.

Figure 24:
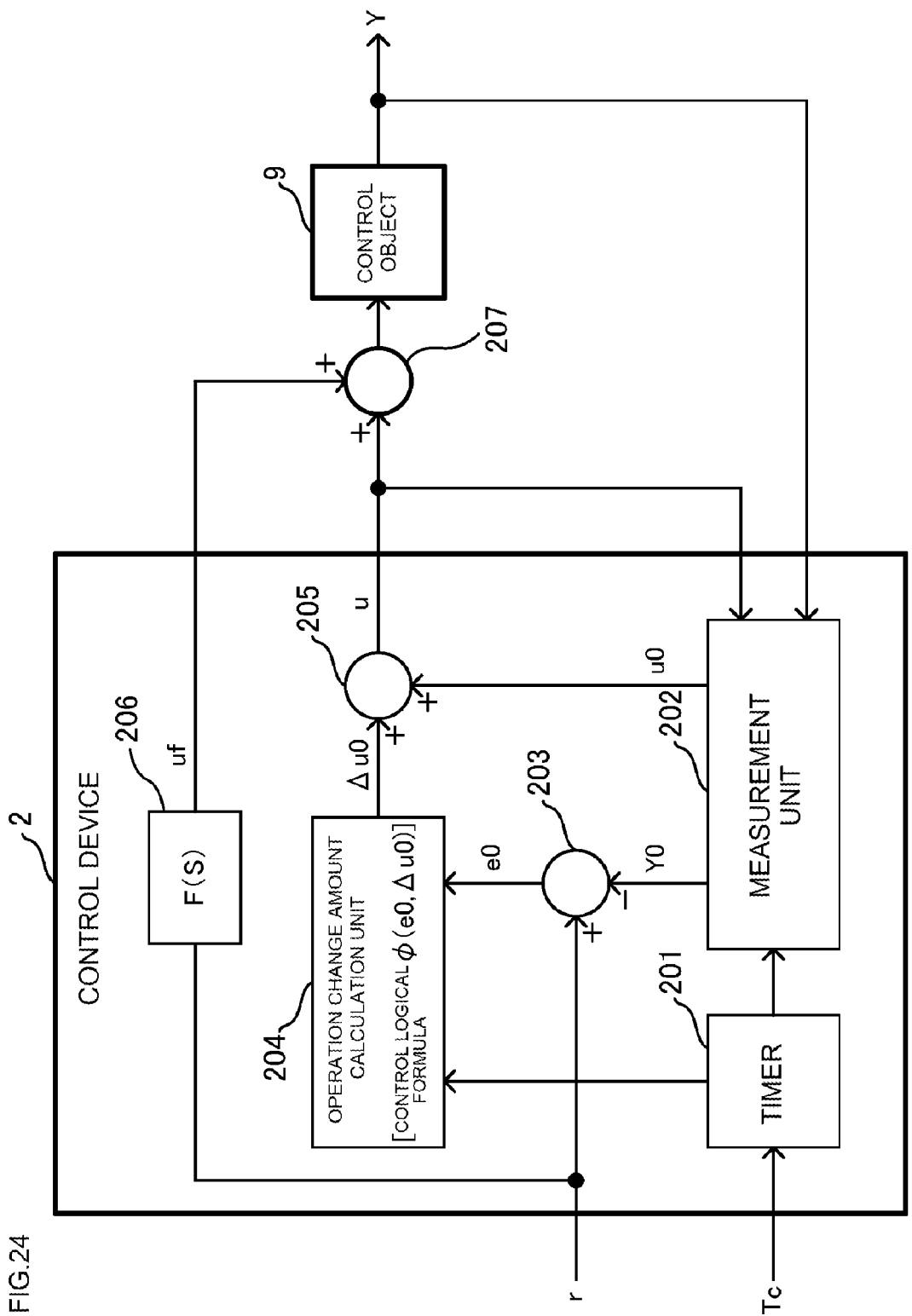
FIG. 24 is a block diagram showing a configuration of a control device provided with a control logical formula which is generated by the control system design assist device.
Figure 25:
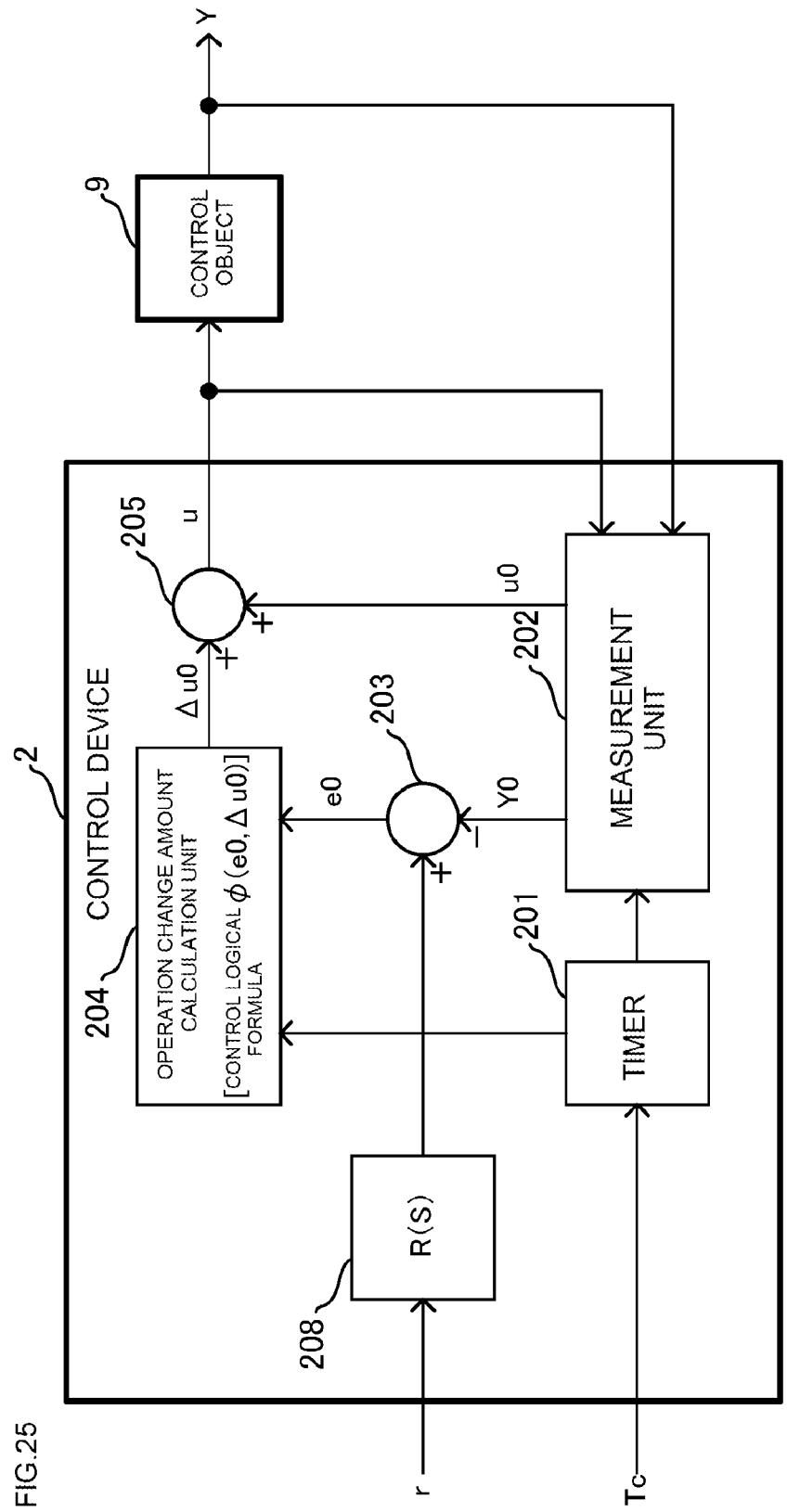
FIG. 25 is a block diagram showing a configuration of a control device provided with a control logical formula which is generated by the control system design assist device.
Figure 26:
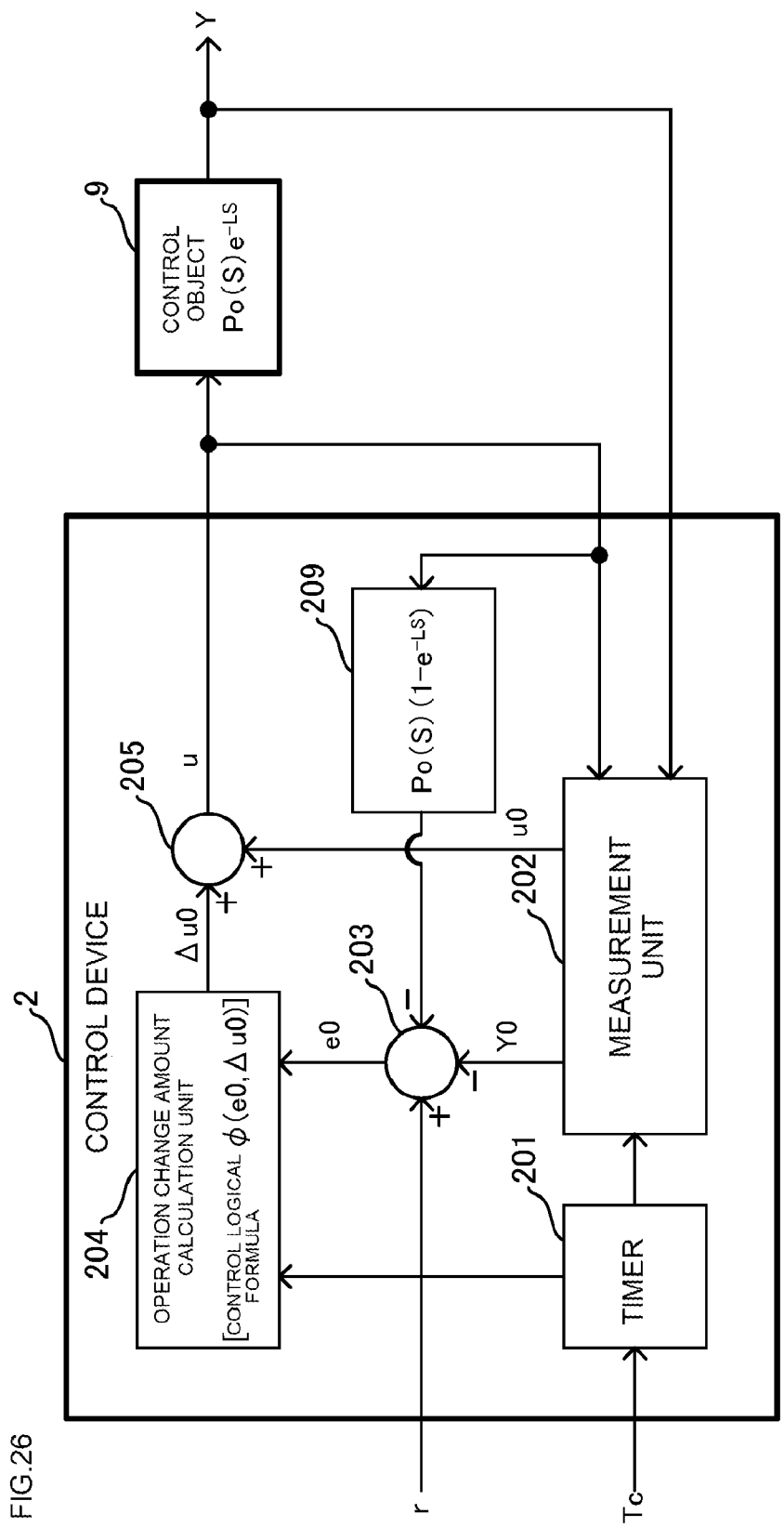
FIG. 26 is a block diagram showing a configuration of a control device provided with a control logical formula which is generated by the control system design assist device.

The control logical formula that is generated by the control system design assist device 1 according to the present embodiment can be applied to control devices 2 of various configurations, such as those shown in FIG. 24 through FIG. 26.

For example, the control device 2 shown in FIG. 24 is an example of a case where a feed-forward controller 206 is provided in the control device 2 shown in FIG. 19.

The feed-forward controller 206 calculates and outputs a feed-forward correction amount of corresponding to the operation amount u, on the basis of the target value r. The operation amount u output from the control device 2 and the feed-forward correction amount uf are combined in the adder 207 and then input to the control object 9.

Furthermore, the control device 2 shown in FIG. 25 is an example of a case where a filter circuit 208 is provided in the control device 2 shown in FIG. 19.

The filter circuit 208 applies a prescribed filtering process to the target value r input to the control device 2 so as to achieve a smooth amount of change per unit time (rate of change) (for example, a moving average of the target value r for a prescribed time period in the past is calculated), and inputs the result to the target deviation calculation unit 203.

Furthermore, the control device 2 shown in FIG. 26 is an example of a case where a Smith compensator 209 is provided in the control device 2 shown in FIG. 19.

The Smith compensator 209 is effective in improving control performance by returning the compensation amount to the control loop as positive feedback, and expelling waste time elements from the control loop when the control object 9 includes the elements of waste of time in operation, as described, for example, in Hashimoto, Hasebe, Kano, "Process Control Engineering", Asakura Publishing Co., Ltd., 2002, p. 99.

Since the compensation amount calculated from the operation amount u by the Smith compensator 209 is provided as positive feedback, then when outputting the current value e0 of the target deviation by subtracting the measurement value Y0 of the control amount from the target value r, the target deviation calculation unit 203 also subtracts the compensation amount calculated by the Smith compensator 209.

In this way, the control logical formula calculated by the control system design assist device 1 according to the present embodiment can be used in various control devices 2. Therefore, it is also possible to control the control object 9 with greater accuracy, by using the abovementioned control logical formula in a control device 2 which is configured as appropriate in accordance with the characteristics of the control object 9, for instance. A control device 2 which is configured as appropriate in accordance with the characteristics of the control object 9 may be, for example, a control device 2 which includes at least one of the abovementioned feed-forward controller 206, filter circuit 208 and Smith compensator 209, or the like.

As described above, in a control system design assist device 1, the logical product (Model∧Rst∧Obj) of the evaluation formulas Model, Rst, Obj generated from the control specifications and the control response waveform is converted into a (first) first-order predicate logical formula $\psi$, and a control logical formula $\phi(e0, \Delta u0)$ indicating the relationship between the current value e0 of the target deviation and the next operation change amount $\Delta u0$ is generated by a quantifier elimination process, and is displayed on a graph, thereby providing a visual depiction of the region of the (e0, $\Delta u0$) coordinates system which satisfies the control specifications. A designer can use this control logical formula $\phi(e0, \Delta u0)$ to design a control system that improves control performance that takes account of time response, such as inverse response, and furthermore, a more simple (less expensive) control logical formula can be created and used within the plotted range of the region of the control logical formula $\phi(e0, \Delta u0)$.

Furthermore, by attaching an existential quantifier (∃) to the variables other than the current value e0 of the target deviation and the operation change amount $\Delta u(s0)$, in the logical product (Model∧Rst∧Obj) of the evaluation formulas Model, Rst, Obj, and converting to a first-order predicate logical formula $\psi$, it is also possible to automatically generate a control logical formula $\phi(e0, \Delta u0)$ indicating the relationship between the current value e0 of the target deviation and the operation change amount $\Delta u0$, by applying a quantifier elimination process.

Moreover, if there is a plurality of sets of control specifications, then by generating a control logical formula for each set of control specifications and displaying these control logical formulas on the same graph, a designer is able to design a control system while investigating whether or not control using stricter control specifications is possible.

Furthermore, in the control device 2, by calculating the operation change amount $\Delta u0$ on the basis of the control logical formula $\phi(e0, \Delta u0)$ generated by the control system design assist device 1 and the current value e0 of the target deviation, at each control cycle Tc, and outputting the updated operation amount u, it is possible to improve the control performance that takes account of time response, such as inverse response, and furthermore, by creating and using a more simple control logical formula within the plotted range of the region of the control logical formula ϕ(e0,Δu0), it is possible to improve the control performance that takes account of time response, at lower cost.

Furthermore, in a program which causes a computer to execute processes corresponding to the response prediction formula generation unit 101, the evaluation formula generation unit 102, the first-order predicate logical formula conversion unit 103, the quantifier eliminating unit 104 and the display unit 107 of the control system design assist device 1, since the logical product (Model∧Rst∧Obj) of the evaluation formulas Model, Rst, Obj generated from the control specifications and the control response waveform are converted to a first-order predicate logical formula ψ, and a control logical formula ϕ(e0,Δu0) indicating the relationship between the current value e0 of the target deviation and the next operation change amount Δu0 is generated by a quantifier elimination process and is displayed on a graph on the display unit 107, then a visual depiction of the region of the (e0,Δu0) coordinates system that satisfies the control specifications is provided, and the designer can use this control logical formula ϕ(e0,Δu0) to design a control system having improved control performance that takes account of time response, such as inverse response.

Furthermore, since the logical product (Model∧Rst∧Obj) of the evaluation formulas Model, Rst, Obj generated from the control specifications and the control response waveform are converted to a first-order predicate logical formula ψ, and a control logical formula 4(e0,Δu0) indicating the relationship between the current value e0 of the target deviation and the next operation change amount Δu0 is generated by a quantifier elimination process and is displayed on a graph, then a visual depiction of the region of the (e0,Δu0) which satisfies the control specifications is provided, and a designer can use this control logical formula ϕ(e0,Δu0) to design a control system having improved control performance that takes account of time response, such as inverse response.

In embodiments according to the present disclosure, including those discussed above, all units or components that perform calculation, control, computing and/or data processing functionalities (such as the response prediction formula generation unit, the evaluation formula generation unit, the first-order predicate logical formula conversion unit, and the quantifier eliminating unit), may be implemented in the form of at least one hardware processor configured to perform these functionalities. That is, the performance of any one or more of the functionalities may be accomplished by a single hardware processor, or be divided, in any manner known to those skilled in the art, among multiple hardware processors.

Although a few embodiments have been shown and described, it would be appreciated by those skilled in the art that changes may be made in these embodiments without departing from the principles and spirit of the invention, the scope of which is defined in the claims and their equivalents.

Reference signs and numerals are as follows:
1 control system design assist device
2 control device
9 control object
100 control logical formula generation unit (computer)
101 response prediction formula generation unit
102 evaluation formula generation unit
103 first-order predicate logical formula conversion unit
104 quantifier eliminating unit
106 input unit
107 display unit (output unit)
108 storage unit
109 bus
201 timer
202 measurement unit
203 target deviation calculation unit
204 operation change amount calculation unit
205 operation amount updating unit
206 feed-forward controller
207 adder
208 filter circuit
209 Smith compensator
300 storage medium

What is claimed is:

1. A control system design assist device which assists design of a control system that controls a control object such that the control object outputs a control amount at a target value, the design assist device comprising:
at least one hardware processor configured to
generate, based on a response waveform of the control amount when an operation amount of the control object is changed, a sequence of control timings at which a target deviation, which is a differential between the target value and the control amount, is evaluated, and a sequence of operation timings at which the operation amount is changed, a response prediction formula predicting a variation value of the control amount, from an initial value of the control amount, at each control timing included in the sequence of control timings by using an amount of change of the operation amount at each operation timing included in the sequence of operation timings;
generate
a first evaluation formula expressing the target deviation at each of the control timings, based on the response prediction formula and a current value of the target deviation, the first evaluation formula being a first logical formula,
a second evaluation formula expressing a first constraint condition for the amount of change of the operation amount at each of the operation timings, the second evaluation formula being a second logical formula, and
a third evaluation formula expressing a second constraint condition for the target deviation at each of the control timings, the third evaluation formula being a third logical formula;
convert a logical product formula, deriving a logical product of the first to third evaluation formulas, into a first first-order predicate logical formula; and
eliminate variables to which a quantifier has been attached in the first first-order predicate logical formula, and generate a control logical formula indicating a relationship between the current value of the target deviation and the amount of change of the operation amount at each of the operation timings; and
a display configured to display a region, in which the control logical formula is established, on a graph.

2. The control system design assist device according to claim 1, wherein the at least one hardware processor is configured to
convert the logical product formula into the first first-order predicate logical formula, in which the quantifier is attached to variables other than the current value of the target deviation and the amount of change of the operation amount at a first operation timing; and generate the control logical formula indicating the relationship between the current value of the target deviation and the amount of change of the operation amount at the first operation timing.

3. The control system design assist device according to claim 1, wherein
the at least one hardware processor is configured to
convert the logical product formula, into a second first-order predicate logical formula, which is different from the first first-order predicate logical formula, and in which the quantifier is attached to variables other than two variables from among:
the amount of change of the operation amount at each of the operation timings,
the control amount at each of the control timings, the target deviation at each of the control timings, and the current value of the target deviation; and
eliminate the variables to which the quantifier has been attached in the second first-order predicate logical formula, and generate a logical relationship formula indicating a relationship between the two variables; and
the display further configured to display, on a graph, a region where the relationship formula, indicating the relationship between the two variables, is established.

4. The control system design assist device according to claim 1, wherein the quantifier is an existential quantifier.

5. The control system design assist device according to claim 1, wherein
the at least one hardware processor is configured to
generate a set of the first to third evaluation formulas from each control specification set in a plurality of control specification sets, each control specification set including a different set of a first constraint and a second constraint,
convert a plurality of the logical product formula, each logical product formula derived from a respective logical product of a respective set of the first, second, and third evaluation formulas, into a respective first first-order predicate logical formula for each control specification set, and
generate a respective control logical formula for each control specification set, and
the display is configured to display regions, where the control logical formula generated for each control specification set are established, on the same graph.

6. A system comprising:
the control system design assist device according to claim 1; and
an operation change amount calculator, comprising at least one hardware processor configured to calculate, at each control cycle, the amount of change of the operation amount corresponding to the current value of the target deviation, based on the control logical formula generated by the control system design assist device.

7. A system comprising:
the control system design assist device according to claim 1; and
a control device configured to control the control amount to the target value, comprising at least one hardware processor configured to
calculate, at each control cycle, the amount of change of the operation amount corresponding to the current value of the target deviation, based on the control logical formula generated by the control system design assist device, measure the control amount and the operation amount, at each control cycle,
calculate the current value of the target deviation, and update the operation amount by adding the amount of change of the operation amount, calculated by the control device, to the operation amount measured.

8. The system according to claim 7, wherein the control device further comprises at least one selected from:
a feed-forward controller configured to calculate a correction amount corresponding to the operation amount, from the target value;
a filter circuit configured to implement a prescribed filtering process on the target value; and
a Smith compensator configured to calculate a compensation amount for correcting the current value of the target deviation, from the operation amount.

9. A non-transitory computer-readable storage medium storing a control system design assist program which assists design of a control system that controls a control amount of a control object, to a target value, the design assist program, when executed by a computer, causes the computer to execute a method comprising processes of:
generating, based on a response waveform of the control amount when an operation amount of the control object is changed, a sequence of control timings at which a target deviation, which is a differential between the target value and the control amount, is evaluated, and a sequence of operation timings at which the operation amount is changed, a response prediction formula predicting an amount of variation of the control amount from an initial value at each control timing included in the sequence of control timings by using the amount of change of the operation amount at each operation timing included in the sequence of operation timings;
generating a first evaluation formula that expresses the target deviation at each of the control timings, based on the response prediction formula and the current value of the target deviation, the first evaluation formula being a first logical formula
generating a second evaluation formula that expresses a constraint condition for the amount of change of the operation amount at each of the operation timings, the second evaluation formula being a second logical formula,
generating a third evaluation formula that expresses a constraint condition for the target deviation at each of the control timings, the third evaluation formula being a third logical formula;
converting a formula deriving a logical product of the first to third evaluation formulas into a first first-order predicate logical formula;
eliminating variables to which a quantifier has been attached in the first first-order predicate logical formula and generating a control logical formula indicating a relationship between the current value of the target deviation and the amount of change of the operation amount at each of the operation timings; and
displaying a region, in which the control logical formula is established, on a graph.

10. A control system design assist method for assisting design of a control system that controls a control amount of a control object, to a target value, the method comprising:
generating, based on a response waveform of the control amount when an operation amount of the control object is changed, a sequence of control timings at which a target deviation, which is a differential between the target value and the control amount, is evaluated, and a sequence of operation timings at which the operation amount is changed, a response prediction formula predicting an amount of variation of the control amount from an initial value at each control timing included in the sequence of control timings, by using an amount of change of the operation amount at each operation timing included in the sequence of operation timings;

generating a first evaluation formula that expresses the target deviation at each of the control timings, based on the response prediction formula and a current value of the target deviation, the first evaluation formula being a first logical formula;

generating a second evaluation formula that expresses a constraint condition for the amount of change of the operation amount at each of the operation timings, the second evaluation formula being a second logical formula;

generating a third evaluation formula that expresses a constraint condition for the target deviation at each of the control timings, the third evaluation formula being a third logical formula;

generating a first-order predicate logical formula conversion process in which a formula deriving a logical product of the first to third evaluation formulas is converted into a first first-order predicate logical formula;

eliminating variables to which a quantifier has been attached in the first first-order predicate logical formula and generating a control logical formula indicating a relationship between the current value of the target deviation and the amount of change of the operation amount at each of the operation timings; and displaying a region, in which the control logical formula is established, on a graph.

* * * * *

UNITED STATES PATENT AND TRADEMARK OFFICE
CERTIFICATE OF CORRECTION

PATENT NO.       : 10,068,035 B2
APPLICATION NO.  : 14/936981
DATED            : September 4, 2018
INVENTOR(S)      : Yoshio Tange Page 1 of 1

It is certified that error appears in the above-identified patent and that said Letters Patent is hereby corrected as shown below:

In the Claims

Column 20, Line 39:
In Claim 9, delete "formula" and insert -- formula; --, therefore.

Column 20, Lines 43-44:
In Claim 9, delete "formula," and insert -- formula; --, therefore.

Signed and Sealed this
Thirteenth Day of November, 2018

Andrei Iancu
*Director of the United States Patent and Trademark Office*